(12) United States Patent
Iguchi et al.

(10) Patent No.: US 10,748,879 B2
(45) Date of Patent: Aug. 18, 2020

(54) IMAGE DISPLAY DEVICE AND DISPLAY

(71) Applicant: SHARP KABUSHIKI KAISHA, Sakai, Osaka (JP)

(72) Inventors: Katsuji Iguchi, Sakai (JP); Koji Takahashi, Sakai (JP); Hidenori Kawanishi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 23 days.

(21) Appl. No.: 16/284,401

(22) Filed: Feb. 25, 2019

(65) Prior Publication Data

US 2019/0267357 A1    Aug. 29, 2019

(30) Foreign Application Priority Data

Feb. 28, 2018  (JP) ................................. 2018-035299
Jan. 18, 2019  (JP) ................................. 2019-006880

(51) Int. Cl.
*H01L 25/075* (2006.01)
*H01L 33/50* (2010.01)
*H01L 33/58* (2010.01)
*H01L 33/00* (2010.01)

(52) U.S. Cl.
CPC ........ *H01L 25/0753* (2013.01); *H01L 33/007* (2013.01); *H01L 33/0093* (2020.05); *H01L 33/507* (2013.01); *H01L 33/58* (2013.01)

(58) Field of Classification Search
CPC . H01L 25/0753; H01L 25/167; H01L 33/007; H01L 33/0079
See application file for complete search history.

(56) References Cited

U.S. PATENT DOCUMENTS

| 7,701,134 B2* | 4/2010 | Yamazaki | H01L 27/1255 257/359 |
| 8,767,108 B2* | 7/2014 | Ogita | H01L 27/14621 348/302 |
| 2013/0070338 A1 | 3/2013 | Gupta et al. | |
| 2016/0125816 A1* | 5/2016 | Chong | G09G 3/20 345/690 |

FOREIGN PATENT DOCUMENTS

JP    2002-141492 A    5/2002

* cited by examiner

*Primary Examiner* — Thao P Le
(74) *Attorney, Agent, or Firm* — ScienBiziP, P.C.

(57) ABSTRACT

An image display device includes a plurality of micro light-emission elements that constitute a pixel and that are provided on a driving circuit substrate. The micro light-emission element displays an image by emitting light to a side opposite to the driving circuit substrate. A light convergence portion that converges light is disposed in the pixel.

20 Claims, 50 Drawing Sheets

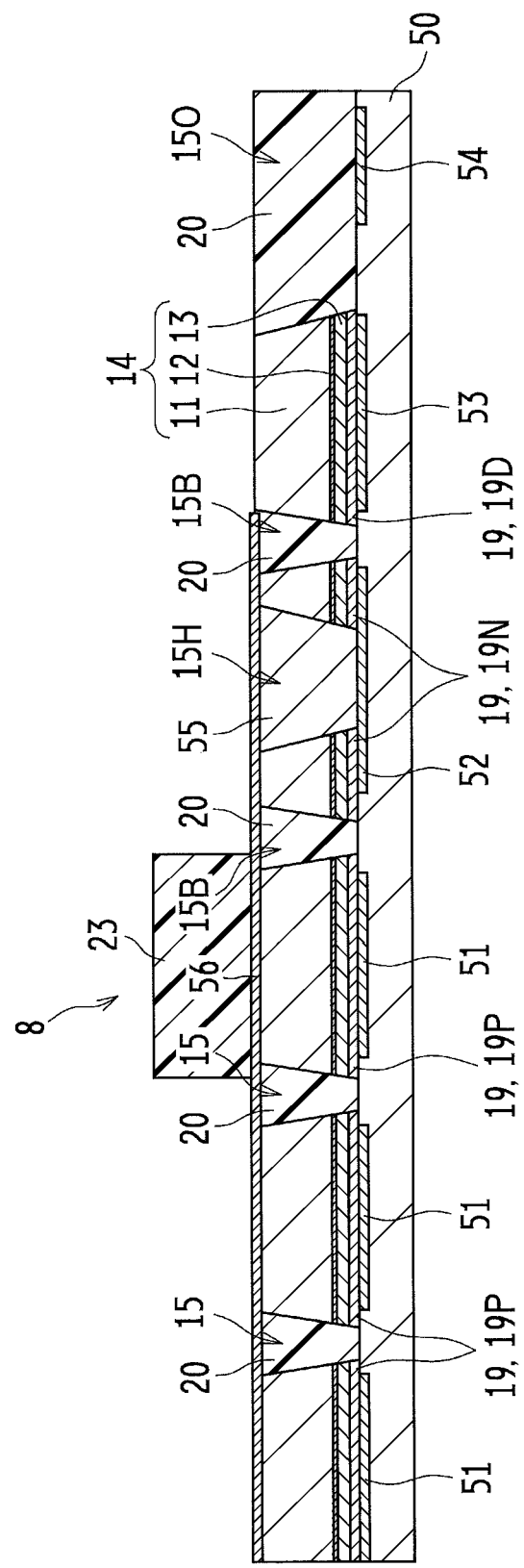

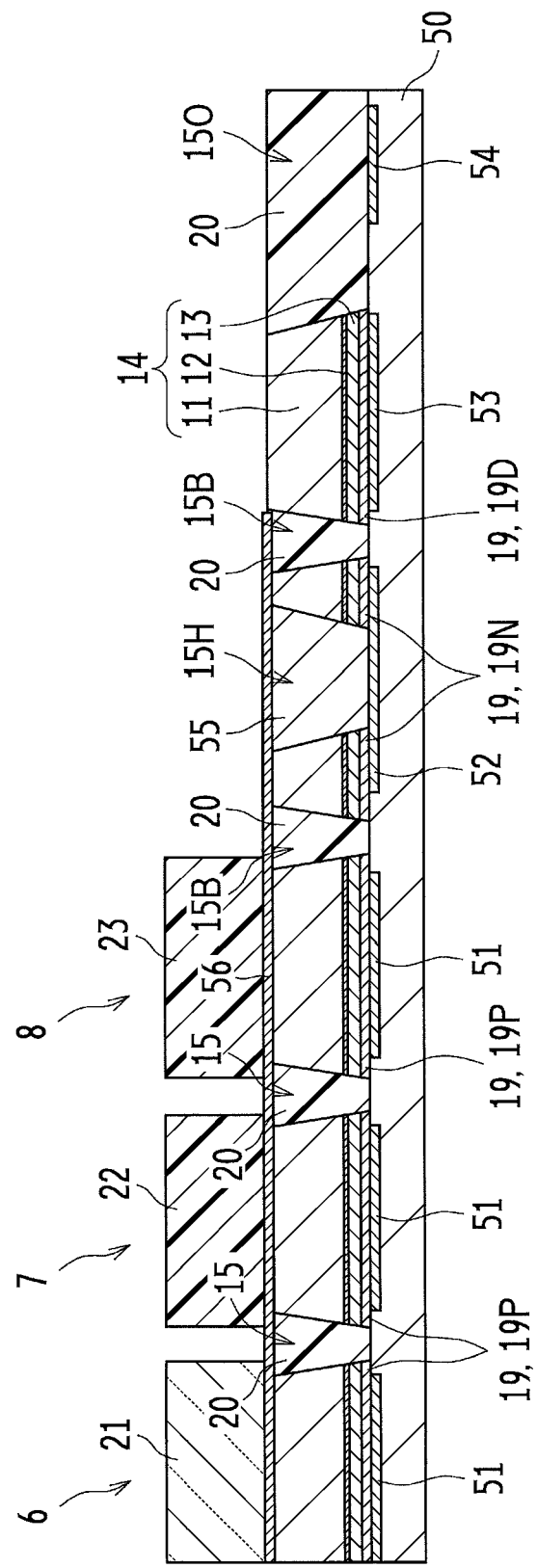

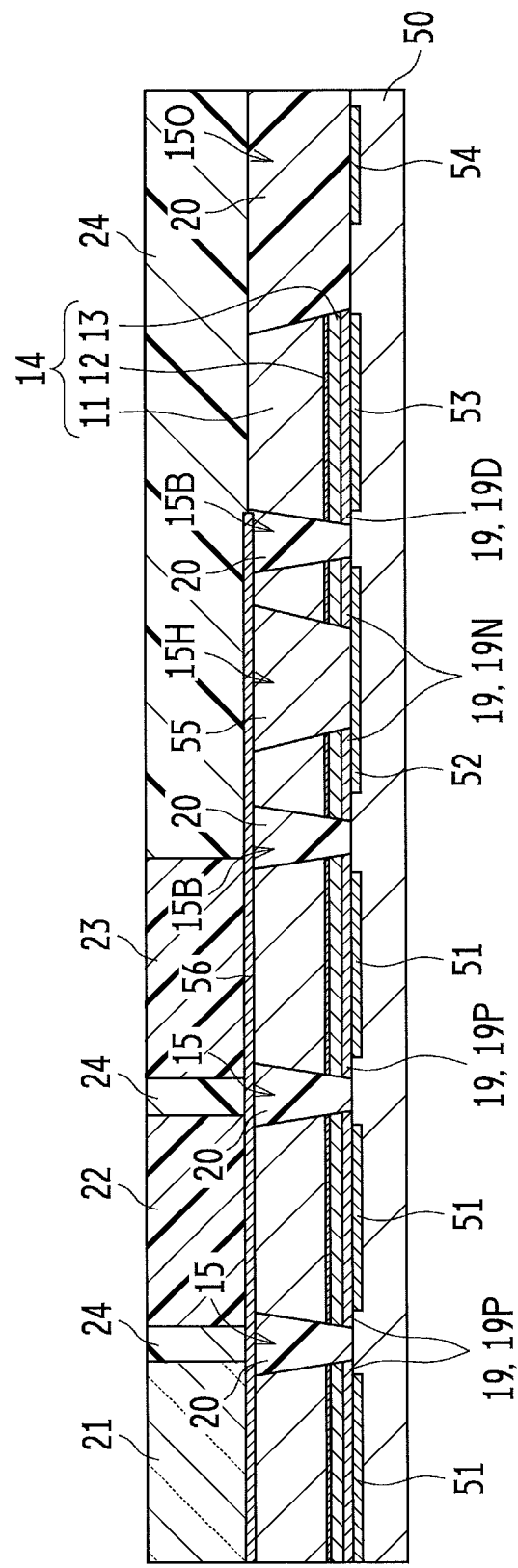

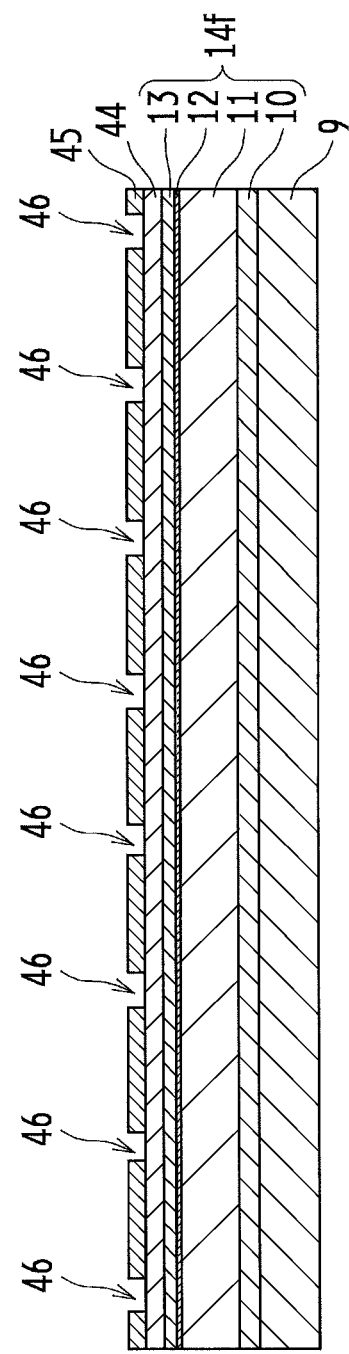

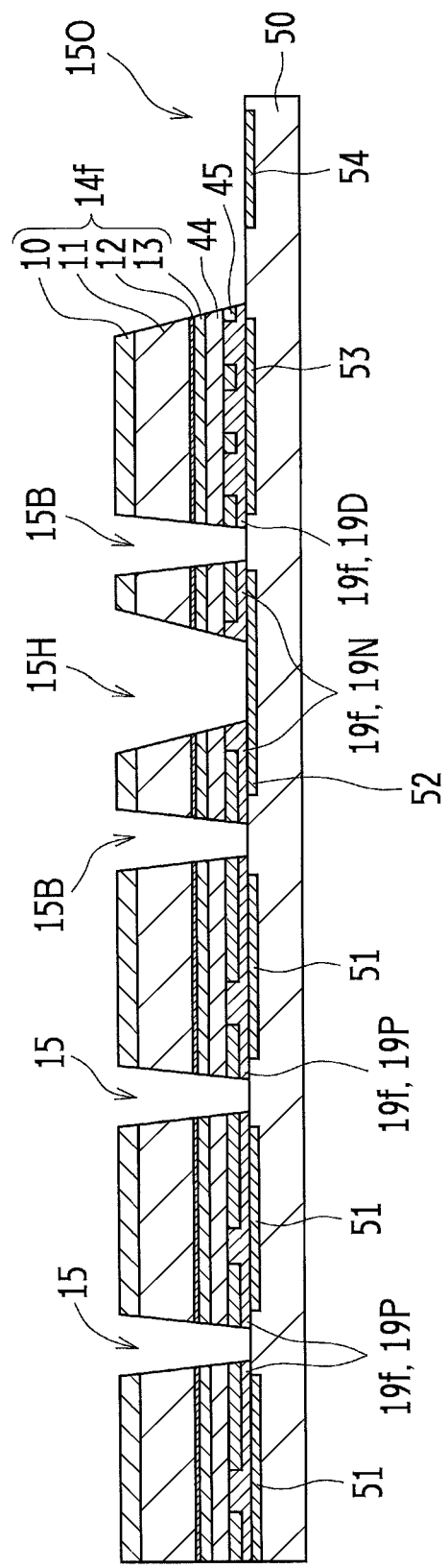

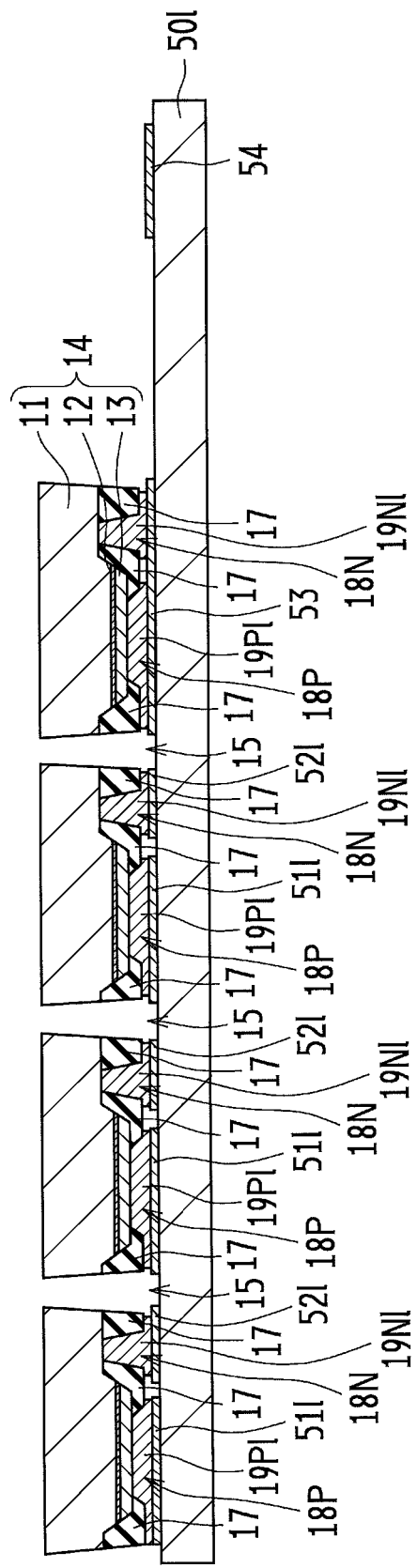

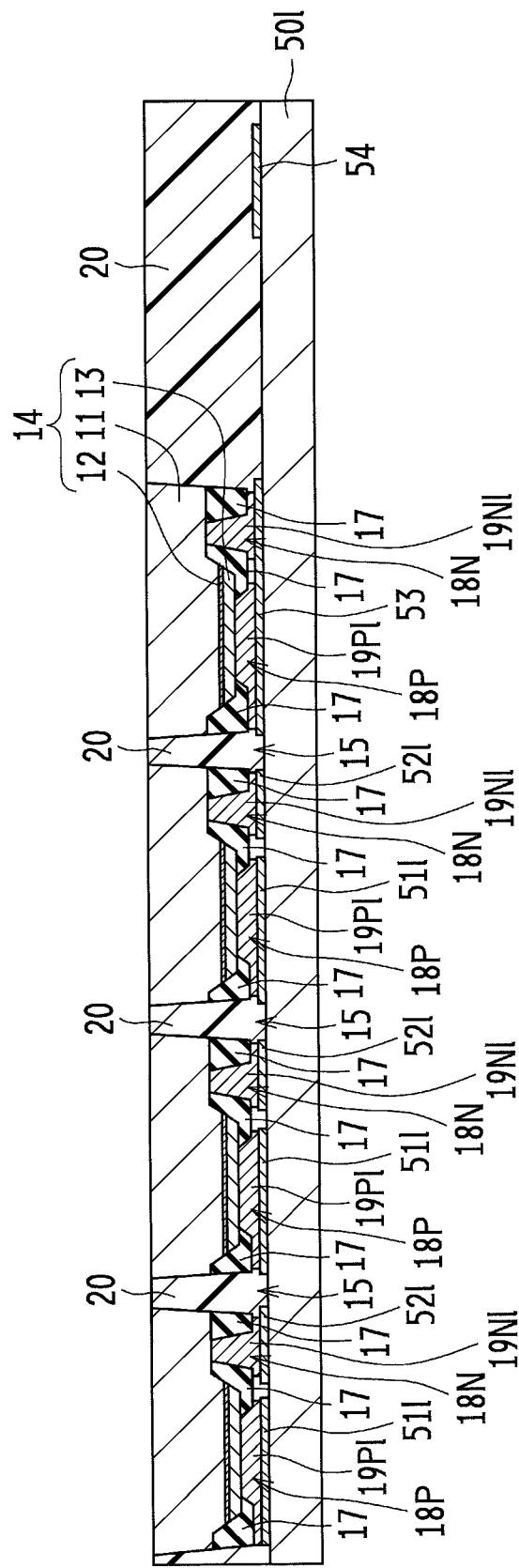

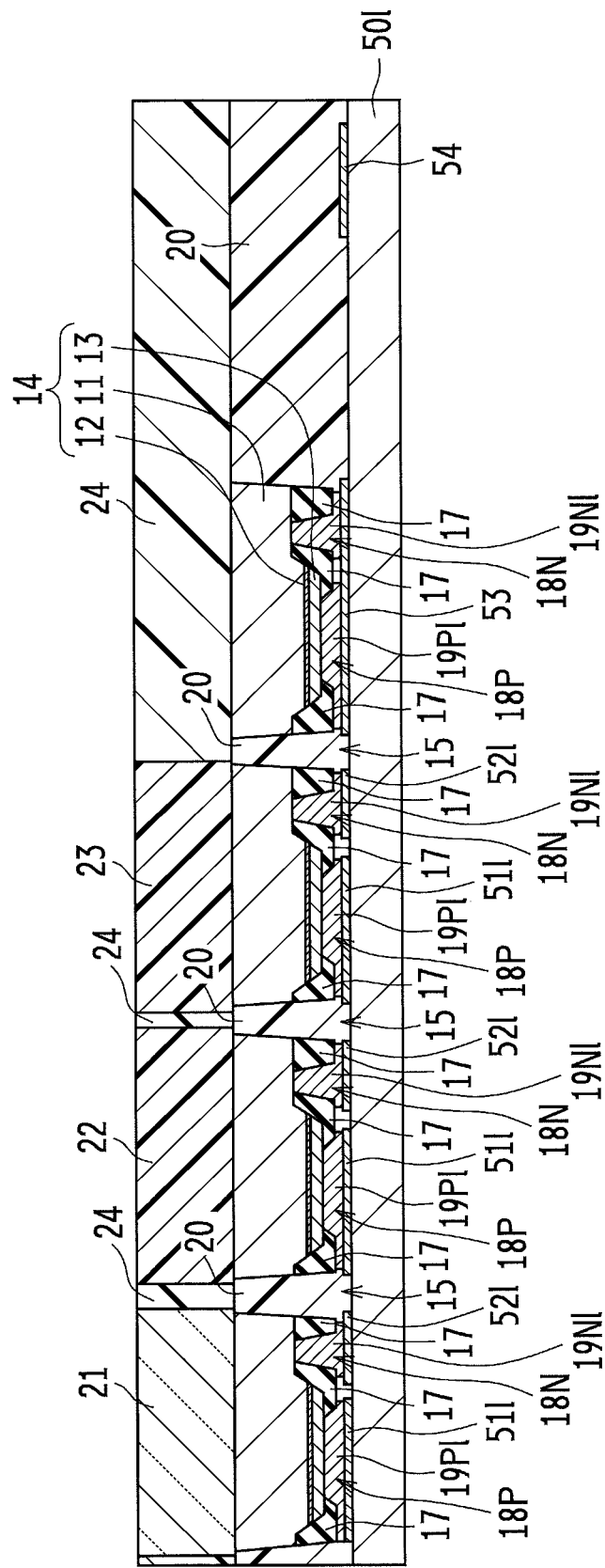

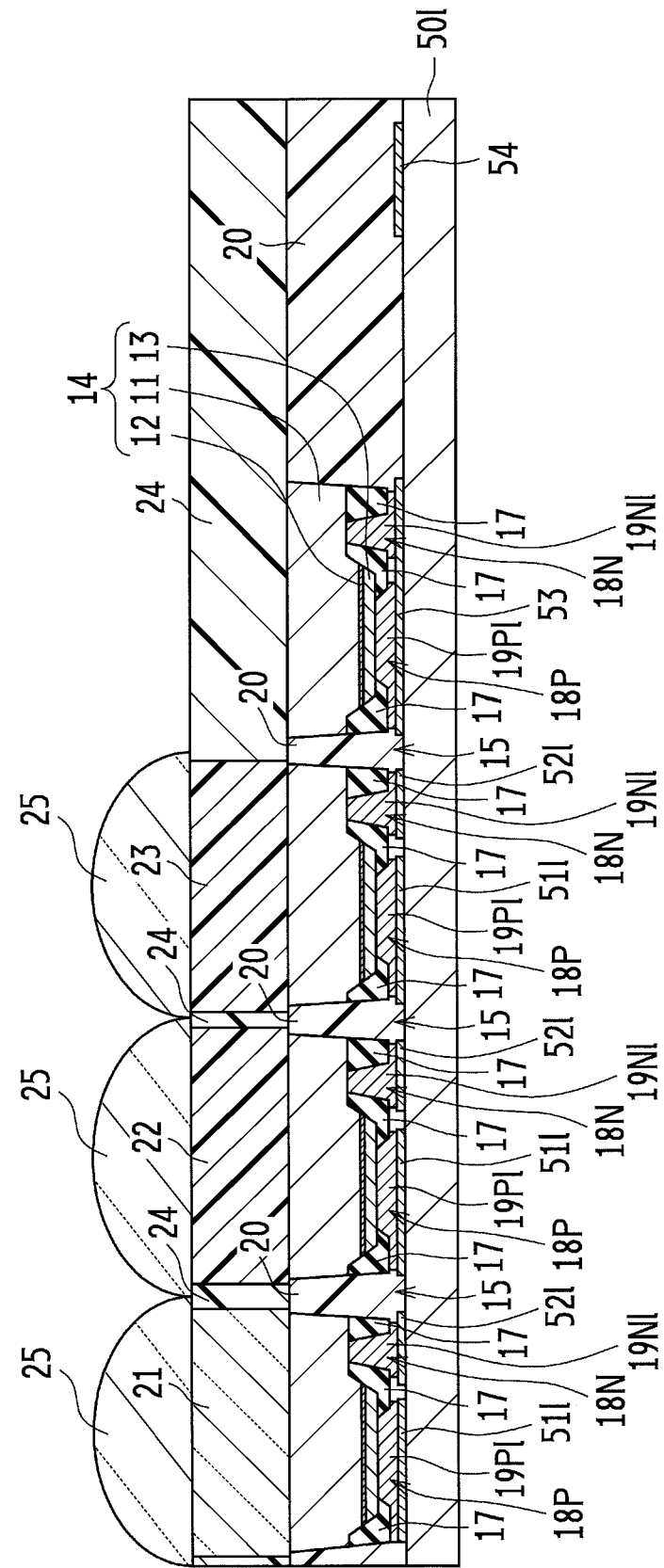

IMAGE DISPLAY DEVICE AND DISPLAY

BACKGROUND

1. Field

The present disclosure relates to an image display device including a plurality of micro light-emission elements that are minute light-emission elements, and a display.

2. Description of the Related Art

An image display device that includes a plurality of micro light-emission elements that constitute a pixel and that are provided on a driving circuit substrate is suggested. For example, in Japanese Unexamined Patent Application Publication No. 2002-141492, a small image display device that displays a color image by forming a driving circuit on a silicon substrate, arranging a minute ultraviolet light-emission diode (LED) on the driving circuit, and disposing a wavelength conversion layer converting ultraviolet light into visible light of red, green, and blue is disclosed.

Such an image display device has characteristics of small size, high brightness, and high durability. Thus, the image display device is expected to be used for a glass-type terminal such as an augmented reality (AR) glass-type terminal (refer to U.S. Patent Application Publication No. 2013/0070338) or a display such as a head-up display (HUD). In addition, an image display device in which organic electroluminescence (EL) is deposited as a light-emission layer on a silicon substrate in which a driving circuit is formed is already in use. However, there is room for improvement in terms of brightness and durability.

The display such as the glass-type terminal or the HUD superimposes light from an outside world with light from the image display device by a combiner device. By doing so, the image formed by the image display device can be displayed in a superimposed manner on a scenery of the outside world to an observer. An imaging optical system, which projects the image formed by the image display device on the eyes of the observer, is disposed between the image display device and the combiner device. In order to use the light emitted by the image display device effectively, the imaging optical system has to converge the light emitted by the image display device as much as possible. For example, in a case where an imaging optical element of the imaging optical system is a lens, the aperture of the lens has to be increased. In addition, in a case where the imaging optical element of the imaging optical system is a curved reflection mirror, the diameter of the reflection mirror has to be increased. In order to increase the amount of convergence, the size of the imaging optical system has to be increased. In a case where the imaging optical system is increased, the sizes and weights of the glass-type terminal or the HUD are increased and it is not preferable for the observer.

In order to use such a display comfortably, the display has to be light and small. However, it is not easy to realize small and light display with superior characteristics such as higher brightness and longer operation time by effectively using the emitted light of the image display. That is, for the image display device including the plurality of micro light-emission elements, effective usage of emitted light without increasing the size of the imaging optical system is desired.

It is a purpose of this invention to provide an image display device including a plurality of micro light-emission elements, which enables effective use of emitted light without increasing the size of an imaging optical system, and also to provide a display with such a an image display device.

SUMMARY

According to an aspect of the disclosure, there is provided an image display device including a plurality of pixels, which include micro light-emission elements provided on a driving circuit substrate. The micro light-emission element displays an image by emitting light to a side opposite to the driving circuit substrate. A light convergence portion that converges light is disposed in the pixel. In addition, an AR display of one embodiment of the present disclosure includes the image display device, an imaging optical element, and a combiner optical element. For example, the micro light-emission element can be exemplified by a micro LED element including a plurality of minute light-emitting diode (LED) elements and a micro laser element including a plurality of minute laser elements.

BRIEF DESCRIPTION OF THE DRAWINGS

FIG. 3J is a sectional view illustrating a tenth manufacturing step for the image display device according to the first embodiment of the present disclosure;

FIG. 3L is a sectional view illustrating a twelfth manufacturing step for the image display device according to the first embodiment of the present disclosure;

FIG. 3M is a sectional view illustrating a thirteenth manufacturing step for the image display device according to the first embodiment of the present disclosure;

FIG. 3O is a sectional view illustrating a fifteenth manufacturing step for the image display device according to the first embodiment of the present disclosure;

FIG. 12B is a sectional view illustrating a second manufacturing step for the image display device according to the fifth embodiment of the present disclosure;

FIG. 12F is a sectional view illustrating a sixth manufacturing step for the image display device according to the fifth embodiment of the present disclosure;

FIG. 19H is a sectional view illustrating an eighth manufacturing step for the image display device according to the ninth embodiment of the present disclosure;

FIG. 19I is a sectional view illustrating a ninth manufacturing step for the image display device according to the ninth embodiment of the present disclosure;

FIG. 19J is a sectional view illustrating a tenth manufacturing step for the image display device according to the ninth embodiment of the present disclosure;

FIG. 19K is a sectional view illustrating an eleventh manufacturing step for the image display device according to the ninth embodiment of the present disclosure;

DESCRIPTION OF THE EMBODIMENTS

Figure 1:
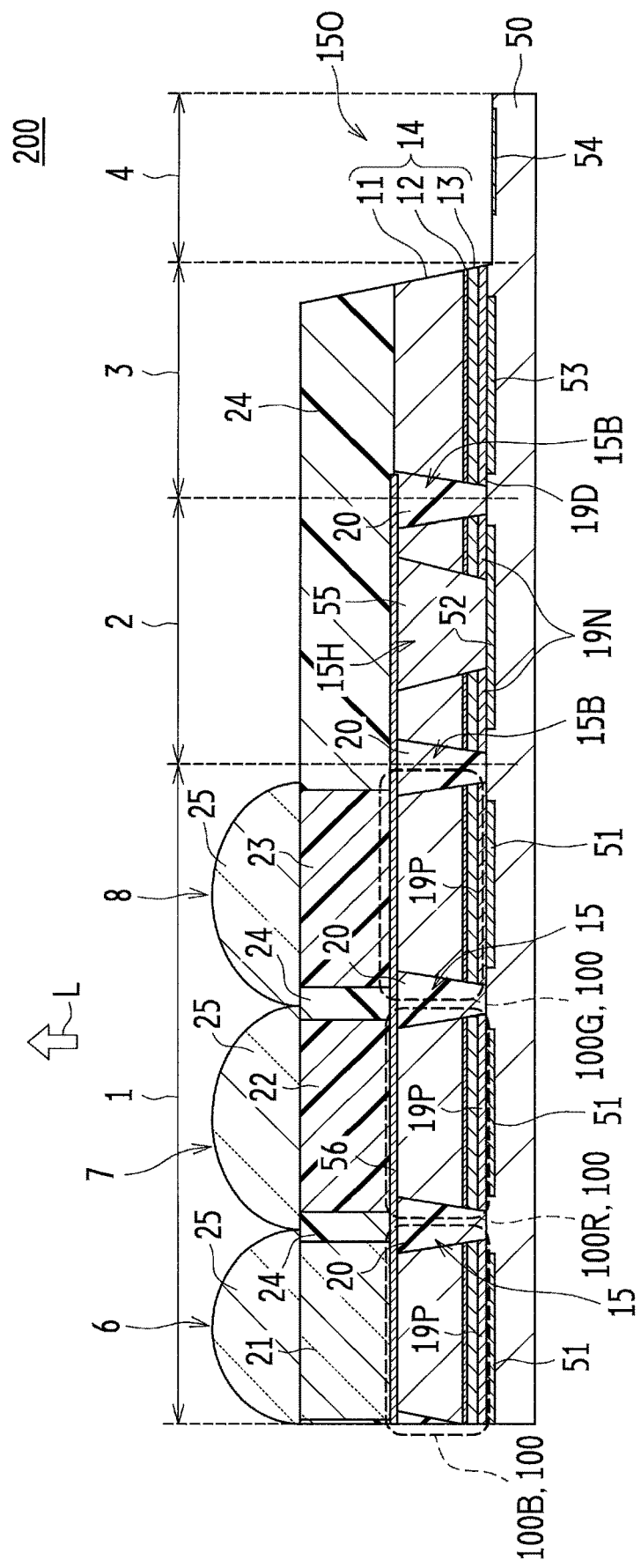
FIG. 1 is a sectional view of an image display device according to a first embodiment of the present disclosure.

In the description of embodiments below, a detailed description related to a driving circuit substrate 50 is not provided. For example, the driving circuit substrate 50 is a silicon substrate (semiconductor substrate) in which LSI is formed, and can be manufactured using a well-known technology. In addition, a micro light-emission element may have various plan view shapes such as a polygonal shape, a circular shape, and an elliptic shape, and the longest length of the plan view shape is assumed to be less than or equal to 60 μm. In an image display device 200, it is assumed that 3,000 or more micro light-emission elements are integrated in a pixel region 1.

While only a case where a micro light-emission element 100 is a nitride semiconductor that emits light in a wavelength range of ultraviolet light to green is described, the nitride semiconductor can be replaced with an AlInGaP-based semiconductor emitting light in a wavelength range of yellow green to red, or an AlGaAs-based or GaAs-based semiconductor emitting light in a wavelength range of red to infrared light.

In addition, while only a configuration in which an N-side layer 11 is arranged on a light emission side of a nitride semiconductor layer 14 constituting the micro light-emission element 100 is described, a configuration in which a P-side layer 13 is arranged on the light emission side can also be used. The N-side layer 11, a light-emission layer 12, and the P-side layer 13 are generally optimized by including a plurality of layers and not as a single layer, but such a fact is not relevant to the configuration of the present disclosure. Thus, a detailed structure of each layer is not described. While the light-emission layer is generally interposed between an N-type layer and a P-type layer, the N-type layer and the P-type layer may include non-doped layers or layers having dopants of opposite conductivity. Thus, hereinafter, the N-type layer and the P-type layer will be described as an N-side layer and a P-side layer.

First Embodiment

Hereinafter, the image display device 200 in which the micro LED element 100 according to a first embodiment of the present disclosure is mounted as a light source will be described with reference to FIG. 1, FIG. 2, and FIG. 3A to FIG. 3O. In the present embodiment, the micro LED element is used as the micro light emission element.

Figure 2:
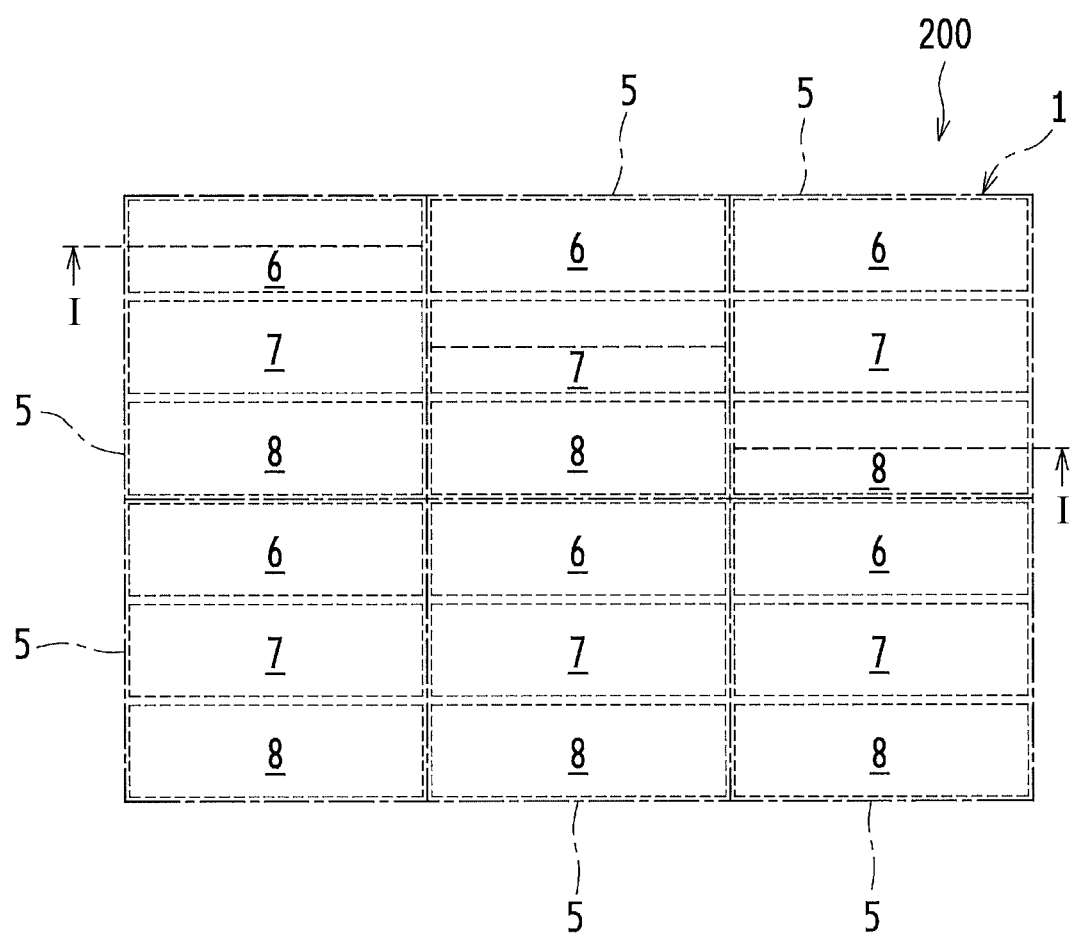
FIG. 2 is a top view of a pixel region of the image display device according to the first embodiment of the present disclosure.

FIG. 1 is a sectional view of the image display device 200 including a plurality of micro LED elements 100. FIG. 2 is a top view of the pixel region 1 of the image display device 200.

Overall Configuration

As illustrated in FIG. 1, the image display device 200 includes the pixel region 1, a common interconnection region 2, a dummy region 3, and a peripheral region 4. As illustrated in FIG. 2, pixels 5 are arranged in an array form in the pixel region 1. Each pixel 5 includes a blue sub-pixel 6, a red sub-pixel 7, and a green sub-pixel 8. The blue sub-pixel 6, the red sub-pixel 7, and the green sub-pixel 8 respectively emit blue light (for example, a peak wavelength of 460 nm±15 nm), red light (for example, a peak wavelength of 630 nm±15 nm), and green light (for example, a peak wavelength of 520 nm±15 nm), and their respective intensities are adjusted. Accordingly, light of various colors can be emitted as the pixel 5. FIG. 1 represents a section of I-I line part illustrated in FIG. 2. The blue sub-pixel 6, the red sub-pixel 7, and the green sub-pixel 8 respectively include micro LED elements 100B, 100R, and 100G that are one example of a micro light-emission element. Any of the micro LED elements 100B, 100R, and 100G has the same structure and emits blue light. Hereinafter, in a case where the micro LED elements 100B, 100R, and 100G are referred to as a whole, the micro LED elements 100B, 100R, and 100G will be denoted by a micro LED element 100. The shape of the blue sub-pixel 6, the red sub-pixel 7, and the green sub-pixel 6 is oblong and they are lined up in parallel as illustrated in FIG. 2. The blue sub-pixel 6, the red sub-pixel 7, and the green sub-pixel 8 do not have to be in such a shape and arrangement pattern. Appropriate changes can be made depending on the size or application desired for each sub-pixel. In addition, the shape is not limited to a rectangle. Furthermore, a sub-pixel of another color such as yellow can be added as desired. In the case of use for application that does not use full color as display color, the pixel can include one kind or two or more kinds of sub-pixels.

Each of the micro LED elements 100B, 100R, and 100G includes a nitride semiconductor layer 14, a P-electrode 19P (first electrode), and a common N-electrode 56 (second electrode). In each of the micro LED elements 100B, 100R, and 100G, the common N-electrode 56 is arranged on a light emission surface side of the nitride semiconductor layer 14, and the P-electrode 19P is arranged on a side of a driving circuit substrate 50 of the nitride semiconductor layer 14. The surface of the micro LED element 100 on the light emission side is referred to as a light emission surface of the micro LED element 100. The P-electrode 19P is connected to a P-drive electrode 51 on the driving circuit substrate 50. The common N-electrode 56 is connected to an N-drive electrode 52 on the driving circuit substrate 50 through a plug 55 in the common interconnection region 2. Each micro LED element 100 emits light by being supplied with a current from the corresponding P-drive electrode 51. A light emission direction L is a direction opposite the driving circuit substrate 50 and is on a side of the common N-electrode 56. The micro LED elements 100B, 100R, and 100G are individually divided by a pixel isolation trench 15. The pixel isolation trench 15 is filled with a filling material 20. The isolation of the micro LED element 100 is desirable for inhibiting light crosstalk between pixels. In a case where the nitride semiconductor layer 14 is connected between the adjacent micro LED elements 100, light generated in a certain micro LED element 100 is emitted to the outside from the adjacent pixel through the nitride semiconductor layer 14 (light crosstalk). Light crosstalk degrades the contrast and color purity of a display image and thus, is not preferable. The filling material 20 inhibits light crosstalk, planarizes the surface, and facilitates formation of the common N-electrode 56 and a wavelength conversion portion and a light convergence portion on the common N-electrode 56.

The peripheral region 4 defines the periphery of the image display device 200 and includes a scribe region for cutting the image display device 200 into dice and a portion connected with an external circuit such as a wire bond pad. In the peripheral region 4, the nitride semiconductor layer 14 is removed. The dummy region 3 is a region of the image display device 200 other than the pixel region 1, the common interconnection region 2, and the peripheral region 4. While the nitride semiconductor layer 14 is arranged in this region, the nitride semiconductor layer 14 does not emit light and is arranged in order to secure surface planarity.

A pixel driving circuit of each pixel is arranged in the pixel region 1 of the driving circuit substrate 50. Electric circuits such as a row selection circuit, a column signal output circuit, an image processing circuit, and an input-output circuit are mostly arranged in the dummy region 3. A dummy-drive electrode 53 on the driving circuit substrate 50 is arranged in order to fix the nitride semiconductor layer 14 and shield the circuits from light. In FIG. 1, reference sign 19N denotes an N-electrode. Reference sign 19D denotes a dummy-drive electrode. Reference sign 24 denotes a planarization portion. Reference sign 54 denotes an I/O-electrode. Reference sign 15B denotes a boundary trench. Reference sign 15H denotes a common electrode contact hole. Reference sign 15O denotes an exposed region.

Configuration of Pixel

Each of the micro LED elements 100B, 100R, and 100G includes the nitride semiconductor layer 14. The nitride semiconductor layer 14 includes an N-side layer 11, a light-emission layer 12, and a P-side layer 13 in order from the light emission surface side. Each of the micro LED elements 100B, 100R, and 100G emits blue light.

The blue sub-pixel 6 includes a transparent portion 21 (transparent layer) on the common N-electrode 56 and emits blue light generated by the micro LED element 100B to the outside. The transparent portion 21 includes a transparent resin layer. The transparent portion 21 may include light scattering particles. The red sub-pixel 7 includes a red wavelength conversion portion 22 (red wavelength conversion layer) and emits red light. The red wavelength conversion portion 22 includes a material that down converts blue light generated by the micro LED element 100R into red light. The green sub-pixel 8 includes a green wavelength conversion portion 23 (green wavelength conversion layer) and emits green light. The green wavelength conversion portion 23 includes a material that down converts blue light emitted by the micro LED element 100G into green light.

The red wavelength conversion portion 22 and the green wavelength conversion portion 23 are resin layers. The red wavelength conversion portion 22 and the green wavelength conversion portion 23 may be collectively referred to as a wavelength conversion portion.

Microlenses 25 (light convergence portions) are individually arranged on the transparent portion 21, the red wavelength conversion portion 22, and the green wavelength conversion portion 23. The microlenses 25 are formed of transparent resin and formed into lens (hemispherical) shapes and have an effect of converging light emitted by the transparent portion 21, the red wavelength conversion portion 22, and the green wavelength conversion portion 23. The microlenses 25 preferably cover the transparent portion 21, the red wavelength conversion portion 22, and the green wavelength conversion portion 23 completely.

In a case where the microlens 25 is not present on the red wavelength conversion portion 22, red light emitted from the red wavelength conversion portion 22 spreads from 0 degrees to 90 degrees of a radiation angle (angle formed by a vertical line and emitted light on the surface of the red wavelength conversion portion 22). In a case where the area of a solid angle is considered, the peak of the radiation intensity of red light is present in a range of approximately 40 degrees to 60 degrees of the radiation angle (refer to plot A in FIG. 4B described below). Accordingly, in order to effectively use red light emitted by the image display device 200, it is preferable to converge at least light at a radiation angle of up to approximately 60 degrees. In a case where an imaging optical element of an imaging optical system is a lens, in order to converge light at a radiation angle θ, an aperture φ of the lens preferably satisfies at least $\phi = 2 \cdot f \cdot \tan\theta$ given that the focal length of the lens is denoted by f. At θ=60 degrees, $\phi \approx 3.5 \cdot f$ is satisfied. In a case where the lens diameter is small, red light that is not converged is either wasted or is reflected inside the device and becomes stray light and may decrease the contrast of a display image.

Thus, by arranging the microlens 25 on the red wavelength conversion portion 22, light at a large radiation angle can be refracted in the light emission direction L. Accordingly, a radiation angle distribution of red light can be narrowed, and red light can be converged in an optical axis direction (refer to plot B in FIG. 4B). Accordingly, convergence efficiency can be increased using a smaller lens (imaging optical element). Alternatively, in a case where the lens size is the same, more light can be converged. Thus, the display image can be brightened. In a case where brightness is fixed, power consumption can be reduced by reducing a drive current of the micro LED element.

The same applies to the case of green light. In addition, in the case of the blue sub-pixel 6, the wavelength conversion portion is not present, and blue light generated by the micro LED element 100B is emitted. However, generally, blue light is isotropically emitted in the light-emission layer 12. Thus, the blue sub-pixel 6 has a radiation angle distribution similar to that in a case where the wavelength conversion portion is present as in the red sub-pixel 7, and the same effect as the case of red light is achieved.

Manufacturing Method

Next, one example of a manufacturing method for the micro LED element 100 will be described with reference to FIG. 3A to FIG. 3O. Each of FIG. 3A to FIG. 3O is a sectional view illustrating first to fifteenth manufacturing steps for the micro LED element 100 and the image display device 200.

Figure 3A:
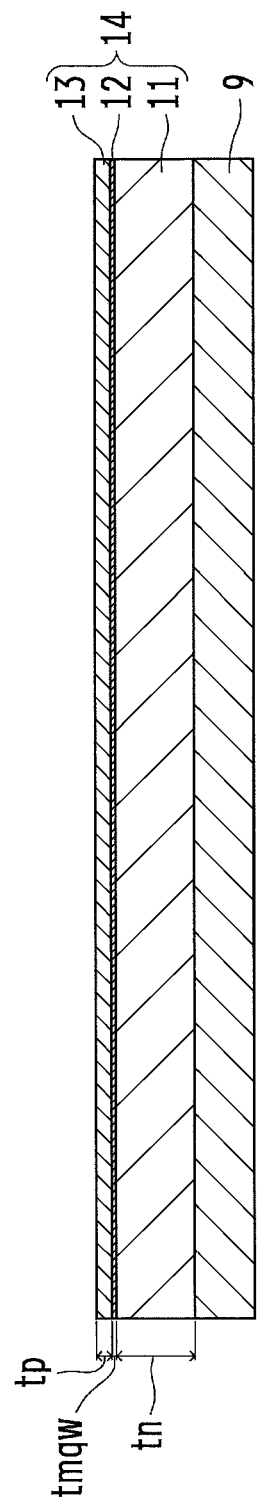
FIG. 3A is a sectional view illustrating a first manufacturing step for the image display device according to the first embodiment of the present disclosure.

As illustrated in FIG. 3A, the nitride semiconductor layer 14 is formed by depositing the N-side layer 11, the light-emission layer 12, and the P-side layer 13 in this order on a growth substrate 9. For example, a (111)-plane silicon substrate can be used as the growth substrate 9. Particularly, the growth substrate 9 has the same size as the driving circuit substrate 50. Sapphire ($Al_2O_3$), SiC, or the like may also be used. In addition, a substance such as a GaN-based semiconductor can be used as a substance constituting the nitride semiconductor layer 14. In addition, for example, a metal organic chemical vapor deposition (MOCVD) apparatus can be used as an apparatus causing the nitride semiconductor layer 14 to grow on the growth substrate 9. The growth substrate 9 may have a textured structure on the surface. The N-side layer 11 has to be conductive in a layer thickness direction. Thus, the N-side layer 11 preferably does not include a high resistance layer inside and is preferably a good N-type conductor throughout the layer thickness direction. In addition, the curvature of the growth substrate 9 is preferably small in a stage where the nitride semiconductor layer 14 is formed in the growth substrate 9 and the growth substrate 9 returns to room temperature. In a case where the growth substrate 9 is an 8-inch wafer, the curvature of the growth substrate 9 is preferably smaller than or equal to 35 μm for easy bonding (step in FIG. 3C described below) to the driving circuit substrate 50. In addition, an appropriate buffer layer may be disposed inside the N-side layer 11. By doing so, a decrease in the curvature of the growth substrate 9 can be effectively implemented.

The light-emission layer 12 may include a multiple-quantum well layer including an InGaN layer and a GaN layer as well and barrier layer, respectively. Or the light-emission layer 12 may be a GaN layer doped with rare earth elements like Eu (Europium), Tm (Thulium), and Er (Erbium). Each of the N-side layer 11 and the P-side layer 13 is configured with various multilayer structures. In the present embodiment, specific configurations of the N-side layer 11, the light-emission layer 12, and the P-side layer 13 are not particularly limited. For example, configurations of an N-side layer, a light-emission layer, and a P-side layer employed by an LED element in the related art can be appropriately employed. Accordingly, the specific configurations of the N-side layer 11, the light-emission layer 12, and the P-side layer 13 will not be described in the present embodiment.

A thickness tn of the N-side layer 11 can be illustratively smaller than or equal to 10 μm in general, and in many cases, is approximately 5 μm±2 μm. A thickness tmqw of the light-emission layer 12 can be illustratively greater than or equal to 10 nm and smaller than or equal to 200 nm in general, and in many cases, is approximately greater than or equal to 50 nm and smaller than or equal to 100 nm. A thickness tp of the P-side layer 13 can be illustratively greater than or equal to 50 nm and smaller than or equal to 1,000 nm in general, and in many cases, is approximately greater than or equal to 100 nm and smaller than or equal to 300 nm.

Figure 3B:
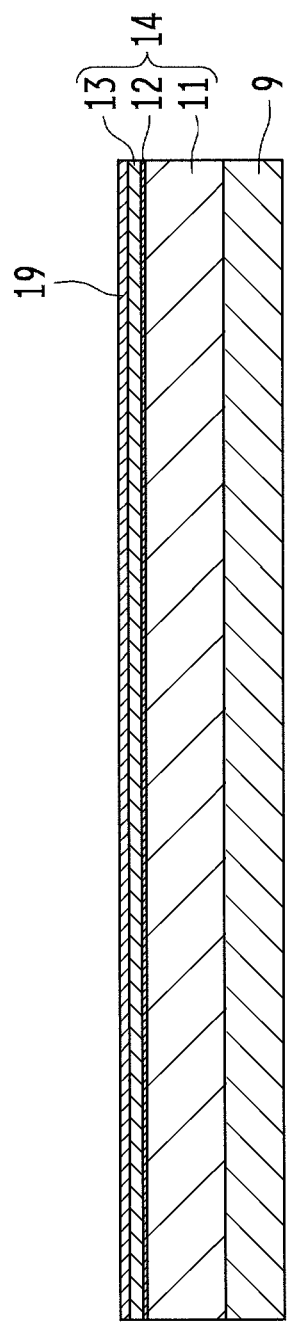
FIG. 3B is a sectional view illustrating a second manufacturing step for the image display device according to the first embodiment of the present disclosure.

As illustrated in FIG. 3B, a P-electrode layer 19 is formed on the whole surface of the P-side layer 13. In this stage, the P-electrode layer 19 is formed on the whole surface of a wafer that is the growth substrate 9, and is not patterned. It is preferable that on the P-side layer 13, the P-electrode layer 19 has a layer that easily forms an ohmic contact with the P-side layer 13. A thin film of palladium or the like, a thin aluminum film having very thin palladium film with thickness of approximately 5 nm on an interface, or a stack layers of indium tin oxide (ITO) as a transparent electrode, nickel, and aluminum are some examples. And it is preferable that on the surface side, the P-electrode layer 19 has a layer such as gold, copper, or likes which easily makes connection with the P-drive electrode 51 (refer to FIG. 3C) on the driving circuit substrate 50.

Figure 3C:
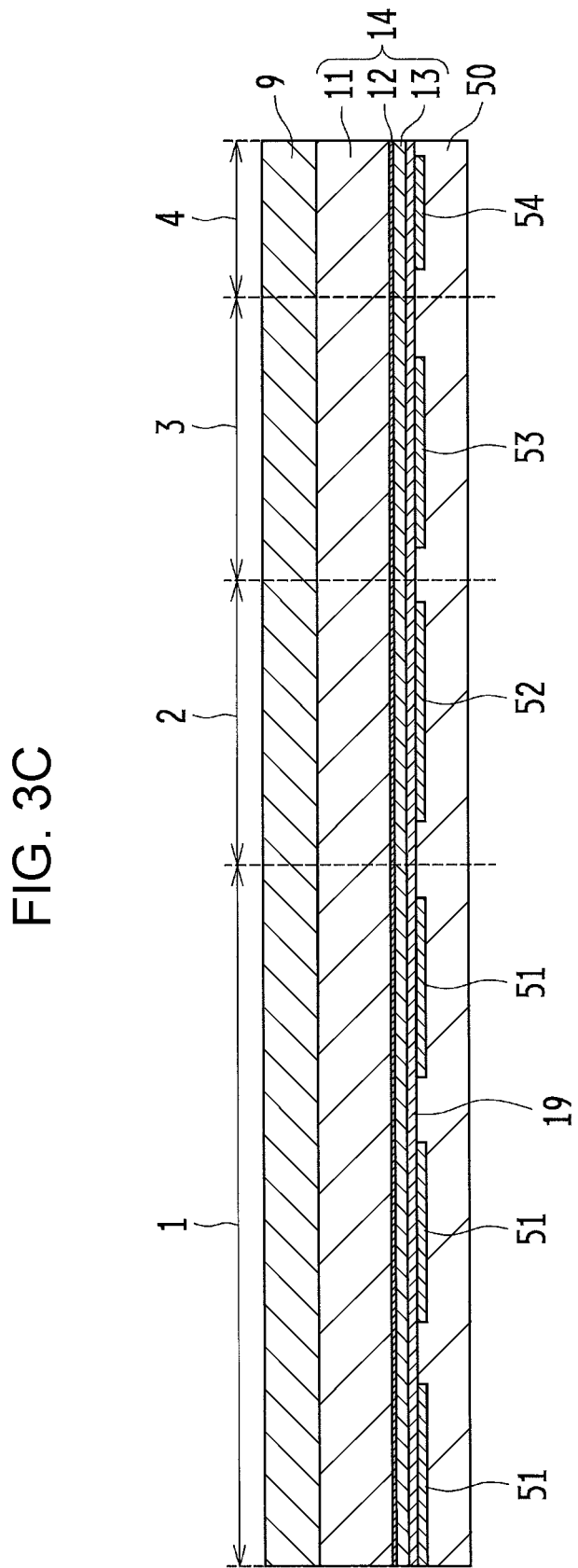
FIG. 3C is a sectional view illustrating a third manufacturing step for the image display device according to the first embodiment of the present disclosure.

As illustrated in FIG. 3C, the growth substrate 9 in which the P-electrode layer 19 is formed on the nitride semiconductor layer 14 is bonded to the driving circuit substrate 50 such that the surface on the P-electrode layer 19 side faces the driving circuit substrate 50. A driving circuit of the image display device 200 is formed in the driving circuit substrate 50. The driving circuit substrate 50 includes electric circuits such as a pixel driving circuit that drives each micro LED element 100, a row selection circuit that selects a specific row among pixels arranged in a two-dimensional array, a column signal output circuit that outputs a light-emission intensity signal of a specific column, and an image processing circuit. The P-drive electrodes 51 supplying a current to each micro LED element 100 in the pixel region 1, the N-drive electrode 52 in the common interconnection region 2, the dummy-drive electrode 53 in the dummy region 3, and the I/O-electrode 54 in the peripheral region 4 are exposed on the surface of the driving circuit substrate 50 before the growth substrate 9 is bonded. While a schematic sectional view of one image display device 200 is illustrated in the example illustrated in FIG. 3A to FIG. 3O, the actual step is performed in the state of a substrate in which a plurality of image display devices 200 are arranged. For example, an 8-inch silicon substrate can be used as the driving circuit substrate 50, and a few hundred driving circuits of the image display devices 200 can be arranged. By this bonding, the P-drive electrode 51, the N-drive electrode 52, the dummy-drive electrode 53, and the I/O-electrode 54 on the driving circuit substrate 50 are connected to the P-electrode layer 19. At this point, the bonding may be performed by connecting metal electrodes (for example, copper) together directly or with metal nanoparticles interposed therebetween as an adhesion layer. In the present bonding step, precise alignment may not be performed. In the case of bonding wafers together, the wafers may simply overlap with each other. In order to avoid stress caused by expansion and contraction due to heating and cooling at the time of bonding, the growth substrate 9 and the driving circuit substrate 50 are preferably of the same material. Particularly, the materials of the growth substrate 9 and the driving circuit substrate 50 are preferably silicon.

Figure 3D:
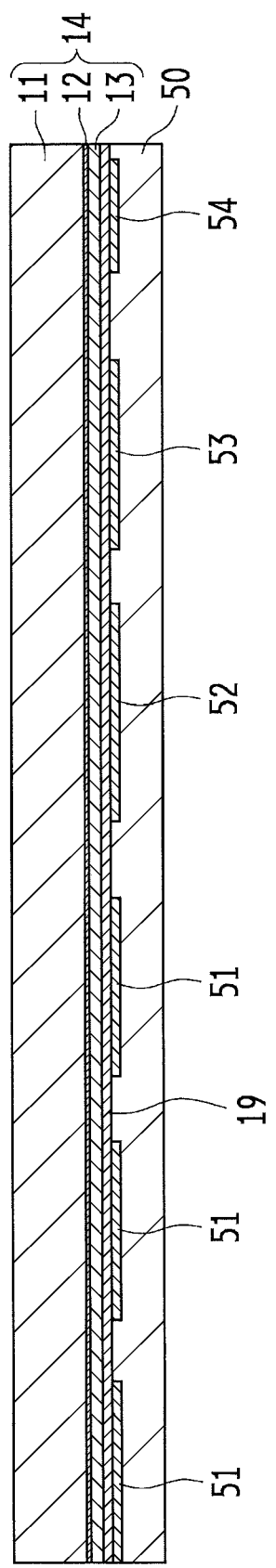
FIG. 3D is a sectional view illustrating a fourth manufacturing step for the image display device according to the first embodiment of the present disclosure.

Next, in a step illustrated in FIG. 3D, the growth substrate 9 is peeled. For example, in a case where the growth substrate 9 is a silicon substrate, the growth substrate 9 can be removed from the nitride semiconductor layer 14 by combining grinding, polishing, plasma etching, wet etching, and the like. In the step illustrated in FIG. 3D, the nitride semiconductor layer 14 is bonded to the driving circuit substrate 50 in a state where the growth substrate 9 is attached. However, the nitride semiconductor layer 14 may be temporarily transferred to another substrate (transfer substrate) and then, may be bonded to the driving circuit substrate 50, and the transfer substrate may be peeled.

Figure 3E:
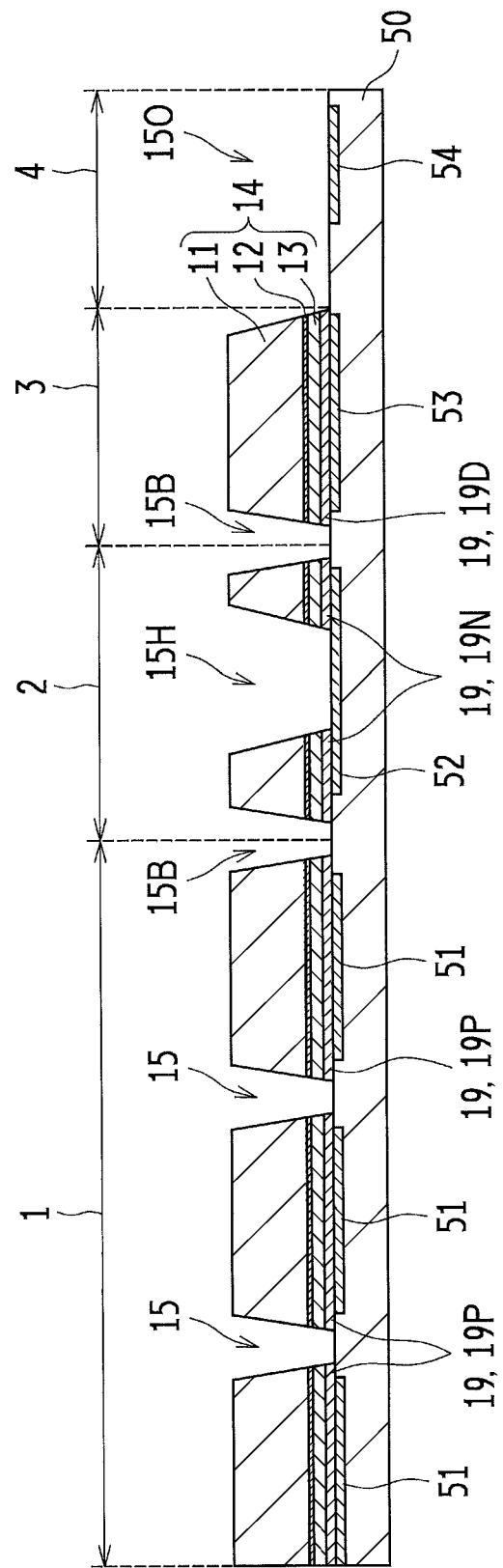
FIG. 3E is a sectional view illustrating a fifth manufacturing step for the image display device according to the first embodiment of the present disclosure.

Next, as illustrated in FIG. 3E, the pixel isolation trenches 15 are formed. The pixel isolation trenches 15 are formed by etching at least the nitride semiconductor layer 14 and P-electrode layer 19. In the pixel region 1, each micro LED element 100 is individually divided by the pixel isolation trenches 15. The P-electrode layer 19 in the pixel region 1 becomes the P-electrodes 19P connected to the P-side layers 13 of the micro LED element 100. The boundary trenches 15B are formed at a boundary between the pixel region 1 and the common interconnection region 2 and a boundary between the common interconnection region 2 and the dummy region 3. The common interconnection region 2 or the dummy region 3 may be further divided by the boundary trench 15B. The P-electrode layer 19 in the common interconnection region 2 becomes the N-electrode 19N connected to the N-drive electrode 52, and the P-electrode layer 19 in the dummy region 3 becomes the dummy-drive electrode 19D. In the peripheral region 4, the nitride semiconductor layer 14 and the P-electrode layer 19 are removed (exposed region 15O), and the I/O-electrode 54 is exposed. In the nitride semiconductor layer 14 in the common interconnection region 2, the common electrode contact hole 15H is formed on the N-drive electrode 52.

As a sectional shape of the pixel isolation trench 15, it is preferable that a side wall of the micro LED element 100 is normally tapered (that is, the width of the pixel isolation trench 15 is increased in a direction of a side opposite to the driving circuit substrate 50) in the sectional view in FIG. 3E. The reason is to easily fill the pixel isolation trench 15 in the subsequent step of forming the filling material 20. In the case of reverse tapering (that is, in a case where the width of the pixel isolation trench 15 is decreased in a direction of the side opposite to the driving circuit substrate 50), air bubbles easily remain in the side wall, and variations in light output may easily occur. However, in a case where a tapering angle greatly deviates from 90 degrees, the area of the light-emission layer 12 is decreased. Thus, the tapering angle is preferably in a range of 70 degrees to 110 degrees.

In steps subsequent to the present step, the driving circuit substrate 50 is processed, and each patterning is precisely aligned with respect to the driving circuit substrate 50. The present step may be separately performed from the step of forming the pixel isolation trench 15 or the boundary trench 15B and the step of forming the exposed region 15O and the common electrode contact hole 15H.

Figure 3F:
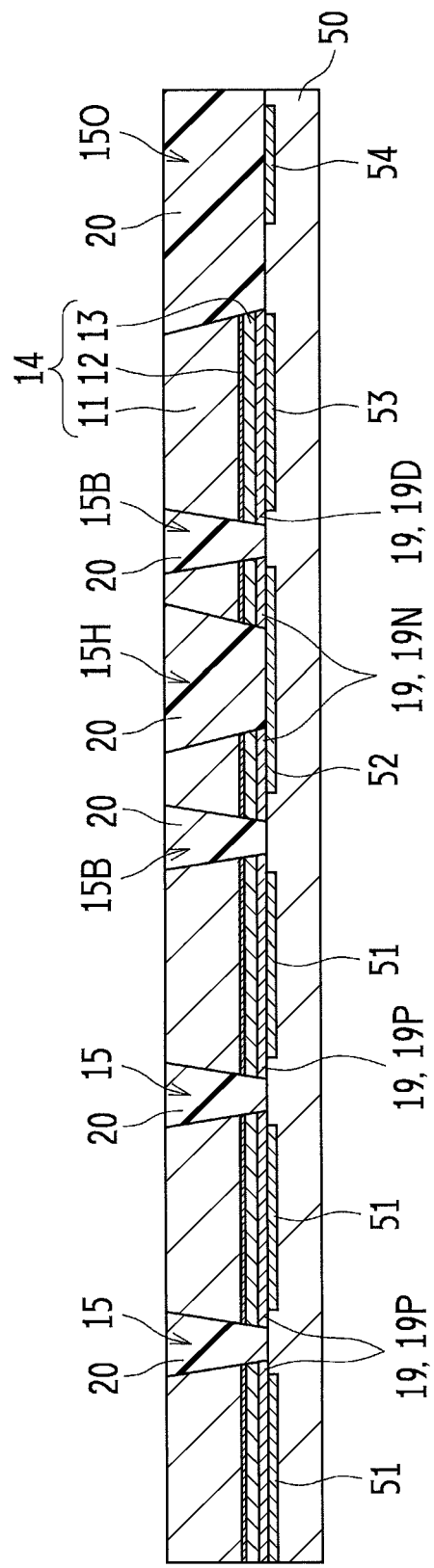
FIG. 3F is a sectional view illustrating a sixth manufacturing step for the image display device according to the first embodiment of the present disclosure.

Next, as illustrated in FIG. 3F, the pixel isolation trenches 15 are filled with the filling materials 20, and the nitride semiconductor layer 14 is exposed. In addition, the boundary trenches 15B, the common electrode contact hole 15H, and the exposed region 15O are also filled with the filling materials 20. The filling materials 20 are layers for the purpose of planarizing the surface in order to form the common N-electrode in the subsequent step, and may be either resin materials or CVD films. In order for light not to leak to an adjacent pixel, resin which contains a light-absorbing pigment, carbon black, or the like, may also be used. Alternatively, in order to reinforce reflection and improve the light output of the micro LED element 100, resin to which a white pigment as a reflection material or scattering particles are added may be used. Alternatively, a leakage of light to the adjacent pixel may be inhibited by disposing a stack structure of a transparent insulating film and a metal film having high reflectance on a side wall of the pixel isolation trench 15.

Figure 3G:
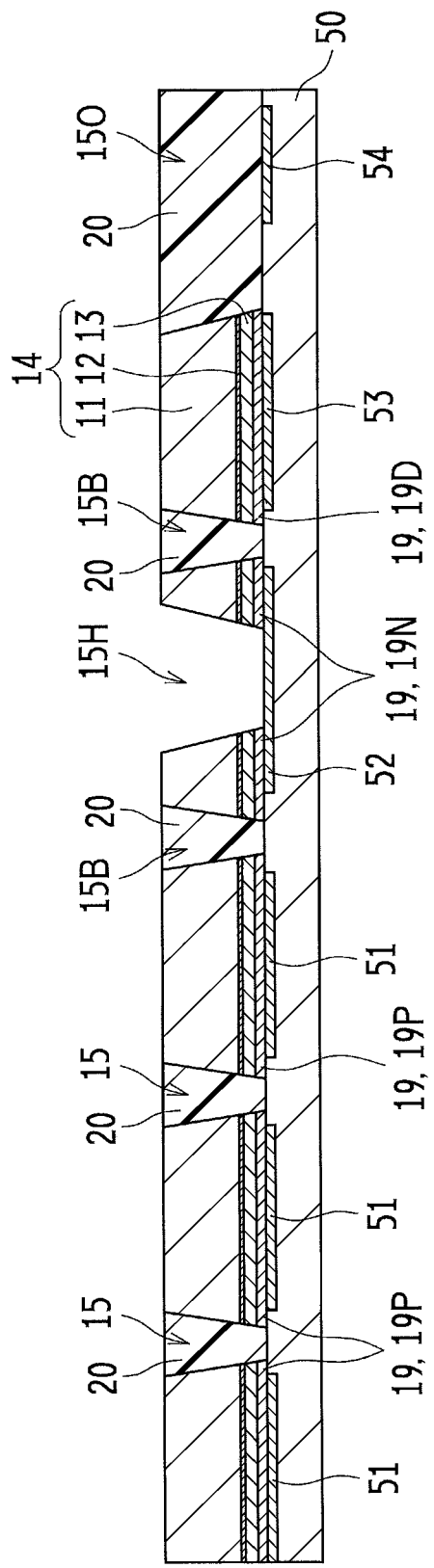
FIG. 3G is a sectional view illustrating a seventh manufacturing step for the image display device according to the first embodiment of the present disclosure.
Figure 3H:
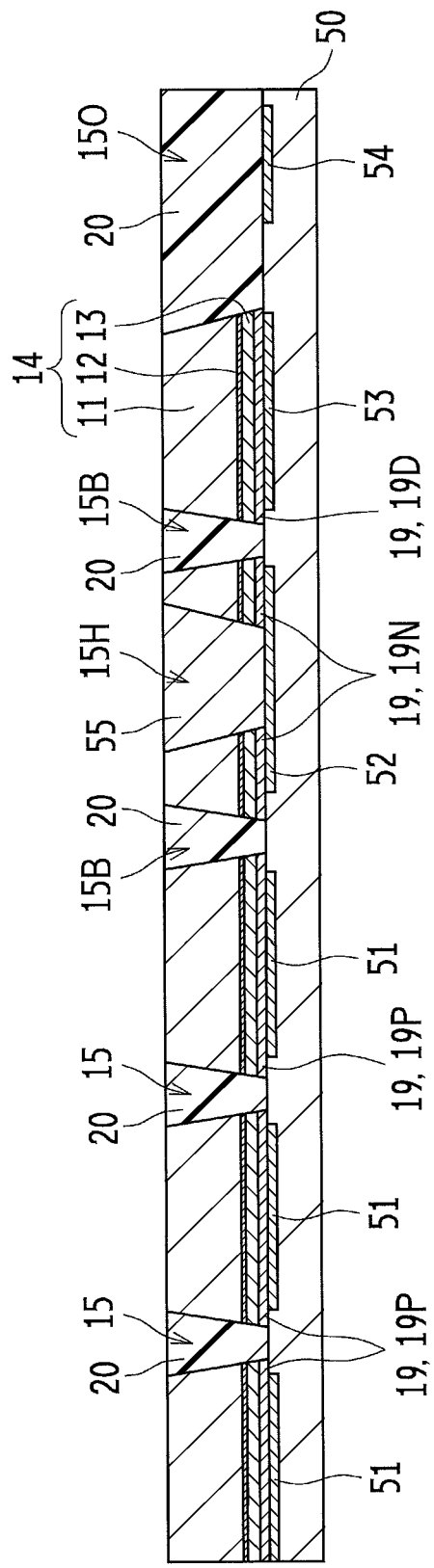
FIG. 3H is a sectional view illustrating an eighth manufacturing step for the image display device according to the first embodiment of the present disclosure.
Figure 3I:
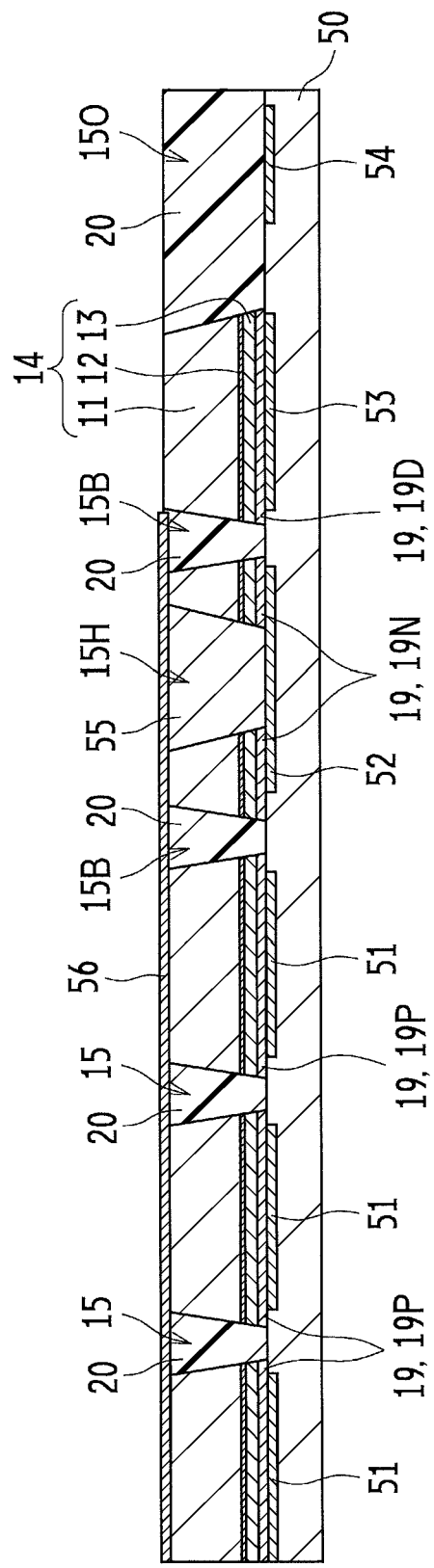
FIG. 3I is a sectional view illustrating a ninth manufacturing step for the image display device according to the first embodiment of the present disclosure.

Next, as illustrated in FIG. 3G, the filling material 20 in the part of the common electrode contact hole 15H is removed. As illustrated in FIG. 3H, the common electrode contact hole 15H is filled with the plug 55. The plug 55 may be a material such as tungsten. Furthermore, as illustrated in FIG. 3I, the common N-electrode 56 is formed. A transparent conductive film of ITO or the like may be employed as the common N-electrode 56. A metal mesh electrode in which most part of the nitride semiconductor layer 14 is an open region and a metal thin film layer is arranged on the pixel isolation trench 15 may be employed. Both may be combined. In the case of the mesh electrode, the mesh electrode may work as the planarization portion 24 described below. The common N-electrode 56 is connected to the N-side layer 11 of the micro LED element 100 and is connected to the N-drive electrode 52 through the plug 55 in the common interconnection region 2.

Next, as illustrated in FIG. 3J, the green wavelength conversion portion 23 is formed on the green sub-pixel 8. This step can be performed using photolithography technology by using a negative-type resist in which wavelength conversion particles are mixed. Alternatively, a mold is formed using a positive-type resist, and a resin containing wavelength conversion particles or scattering particles is applied on the mold. The resin material remaining on the positive-type resist pattern and the positive-type resist material are removed. By doing so, the resin material filling a recessed portion of the mold becomes the green wavelength conversion portion 23. The wavelength conversion particles may be phosphor particles or may be quantum dots or quantum rods. A negative-type resist containing a fluorescent dye may be used instead of the negative-type resist in which the wavelength conversion particles are mixed.

Figure 3K:
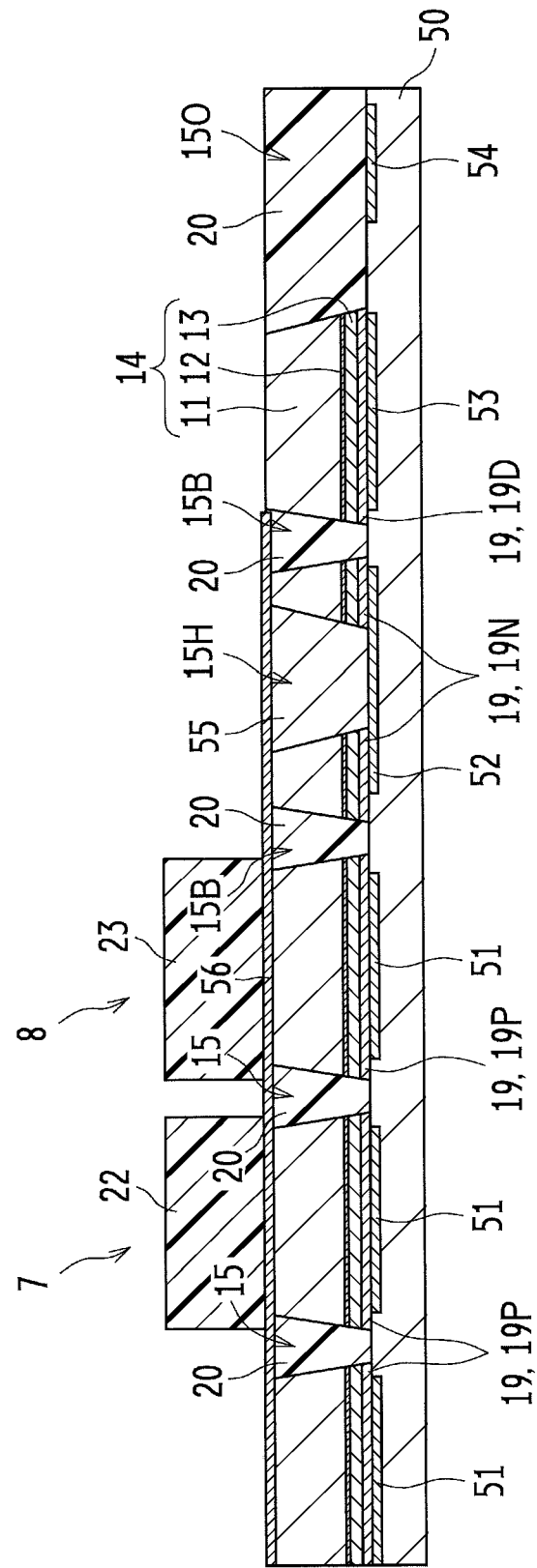
FIG. 3K is a sectional view illustrating an eleventh manufacturing step for the image display device according to the first embodiment of the present disclosure.

Similarly, as illustrated in FIG. 3K and FIG. 3L, the red wavelength conversion portion 22 and the transparent portion 21 are respectively formed on the red sub-pixel 7 and the blue sub-pixel 6. The green wavelength conversion portion 23, the red wavelength conversion portion 22, and the transparent portion 21 preferably have almost the same thickness. By setting the same height as illustrated in the drawings, the formation of the light convergence portion is facilitated. The order of forming the green wavelength conversion portion 23, the red wavelength conversion portion 22, and the transparent portion 21 does not have to be the same as in the present embodiment. An optimal order can be selected depending on the characteristics and the like of each material.

Next, as illustrated in FIG. 3M, the planarization portion 24 is formed. An object of the planarization portion 24 is to planarize the surface in the pixel region 1 by filling the gaps among the green wavelength conversion portion 23, the red wavelength conversion portion 22, and the transparent portion 21 and also planarize the outside of the pixel region 1. The planarization portion 24 is a resin material and may be resin containing a light-absorbing pigment, carbon black, or the like to reduce light leakage to the adjacent sub-pixel. Conversely, in order to reinforce reflection and improve the light output of the sub-pixel, resin containing a white pigment as a reflection material or scattering particles may be used. That is, the planarization portion 24 is a light shielding material that inhibits the leakage of light to the adjacent sub-pixel by light absorption or reflection.

While the planarization portion 24 is formed after forming of the green wavelength conversion portion 23, the red wavelength conversion portion 22, and the transparent portion 21 in the present embodiment, the planarization portion 24 may be formed first, and then, the green wavelength conversion portion 23, the red wavelength conversion portion 22, and the transparent portion 21 may be formed. In this case, after the planarization portion 24 is formed, recessed portions are formed in a region in which the green wavelength conversion portion 23, the red wavelength conversion portion 22, and the transparent portion 21 are to be formed. Then, the green wavelength conversion portion 23, the red wavelength conversion portion 22, and the transparent portion 21 are formed in the recessed portions. The planarization portion 24 may be a transparent resin material covered by a metal film, or may be a metal material. In this case, the metal film and the metal materials are preferably silver or aluminum having high reflectance.

As illustrated in FIG. 1, the planarization portion 24 is preferably arranged above the filling material 20. In other words, it is preferable that the transparent portion 21 and the wavelength conversion portions 22 and 23 completely cover the light emission surface of the micro LED element 100. The reason is that in a case where the bottom surface of the planarization portion 24 overlaps with the light emission surface of the micro LED element 100, light extraction efficiency from the micro LED element 100 to the transparent portion 21 and the wavelength conversion portions 22 and 23 is decreased. In addition, it is preferable that the side surface of the planarization portion 24 is inclined in order to improve the light extraction efficiency from the transparent portion 21 and the wavelength conversion portions 22 and 23. While the inclination angle may be approximately smaller than 90 degrees, it is preferable that the bottom surface of the planarization portion 24 does not overlap with the light emission surface of the micro LED element 100 as described above.

Figure 3N:
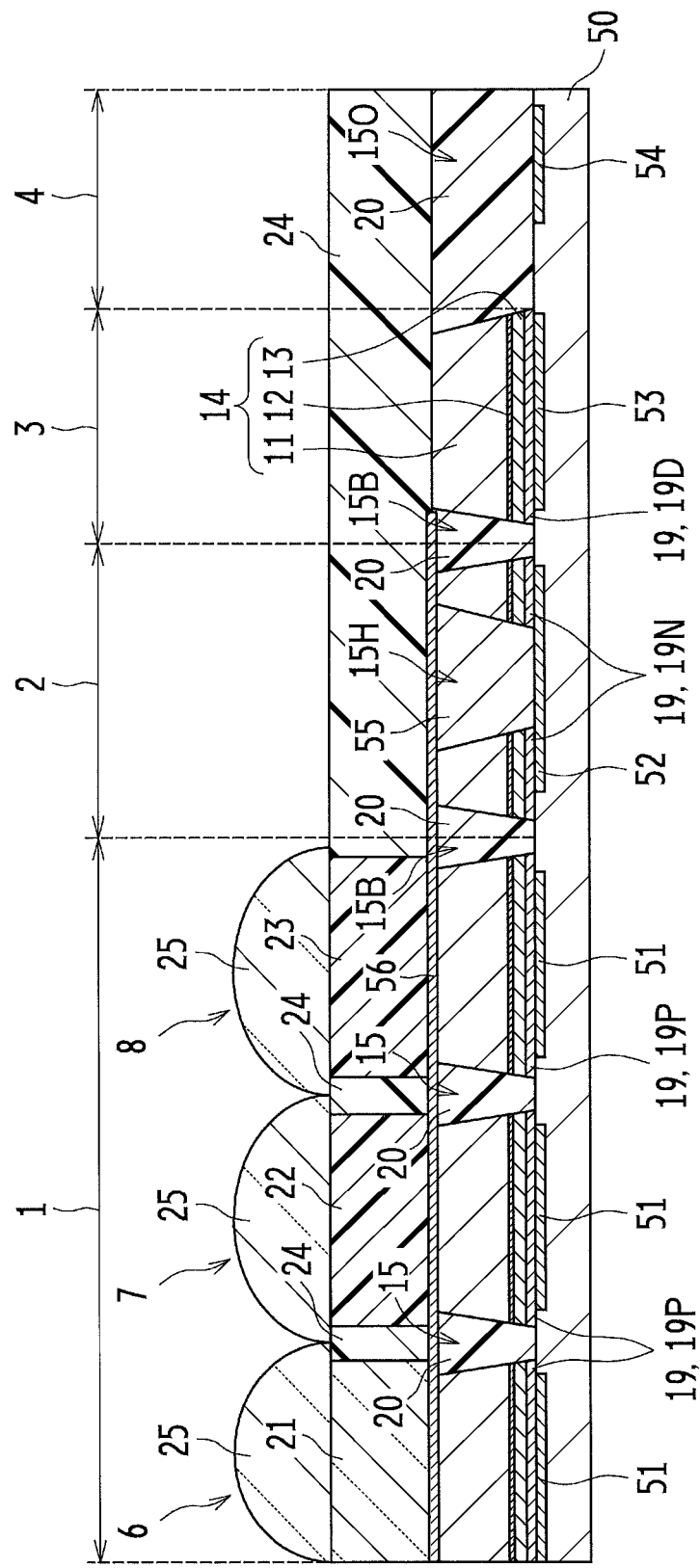
FIG. 3N is a sectional view illustrating a fourteenth manufacturing step for the image display device according to the first embodiment of the present disclosure.
Figure 30:
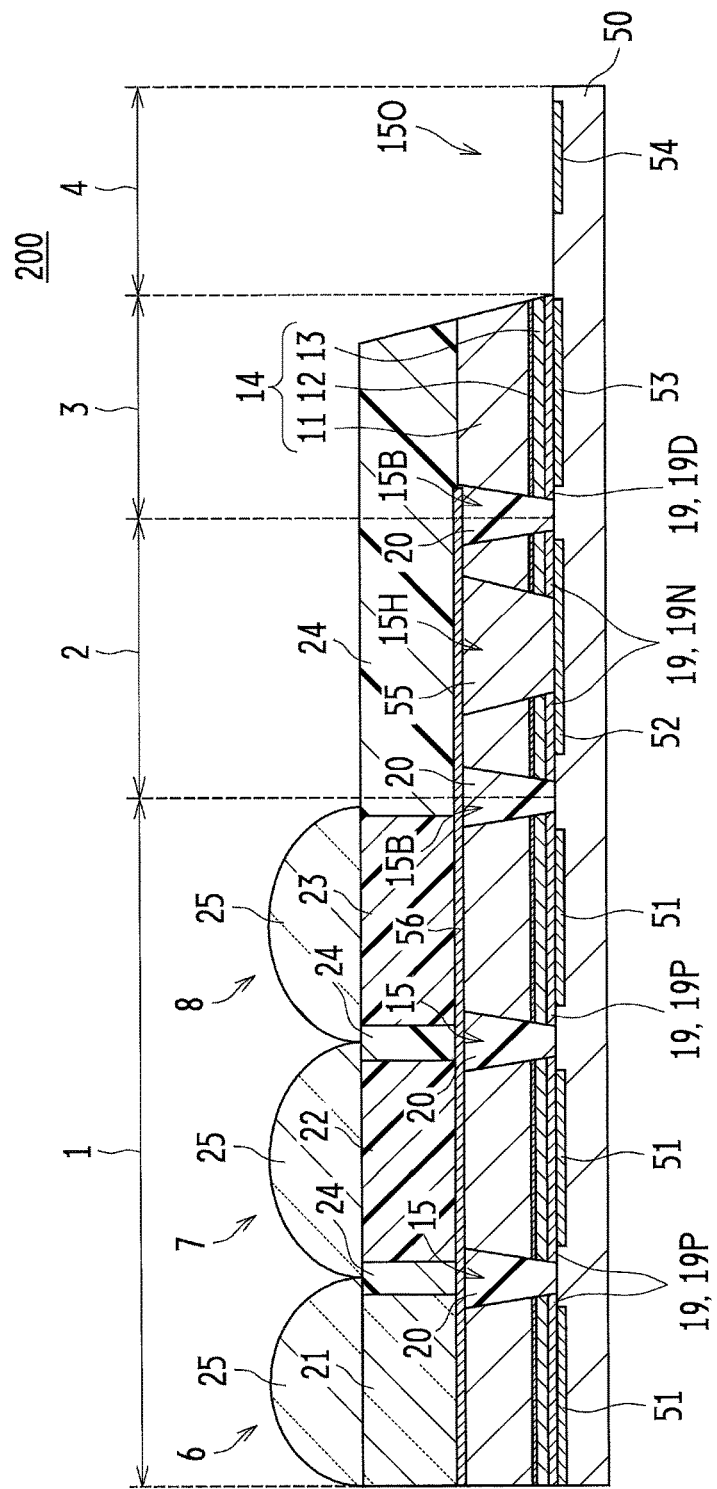

Next, as illustrated in FIG. 3N, the microlenses 25 are formed. The microlenses 25 are made by forming transparent resin into a lens shape and are formed on the blue sub-pixel 6, the red sub-pixel 7, and the green sub-pixel 8. In the present embodiment, the lens shape is formed by forming a transparent resin pattern using photolithography technology and then, applying heat treatment to enhance fluidity and to deform the transparent resin pattern. The microlenses may be formed by pressing a mold having a microlens array shape on to the driving circuit substrate 50 with the transparent resin. While the microlens 25 is arranged in only the pixel region 1 in the present embodiment, the microlens 25 can also be arranged in the dummy region 3 for purposes such that the shape of the microlens 25 inhibits variations by the proximity effect in the peripheral region of the pixel region 1. In addition, as illustrated in FIG. 3N, it is preferable that the microlens 25 completely covers the transparent portion 21 and the wavelength conversion portions 22 and 23.

As illustrated in FIG. 3O, the planarization portion 24 and the filling material 20 are removed in the peripheral region 4, and the I/O-electrode 54 is exposed on the surface. The image display device 200 formed on the driving circuit substrate 50 is eventually individually cut and packaged. The step of exposing the peripheral region is preferably performed after forming of the microlenses 25. In a case where a step is present in the peripheral region, the film thickness of resin forming the microlenses 25 becomes non-uniform, and it is not easy to uniformly form the microlenses 25 in the whole pixel region 1.

To form the common N-electrode 56, the green wavelength conversion portion 23, the red wavelength conversion portion 22, and the transparent portion 21, the whole surface of the image display device 200 is preferably planar as in FIG. 3H. Since the resin layer is applied in many steps, non-uniformity such as striation occurs when the surface of the image display device 200 is not planar. Accordingly, a problem arises in that a uniform wavelength conversion portion may not be formed. In a case where the nitride semiconductor layer 14 is not present in the dummy region 3, a step having a height of a few μm equal to the thickness of the nitride semiconductor layer 14 occurs. Thus, planarity is not secured, and a problem arises. Accordingly, the nitride semiconductor layer 14 in the dummy region 3 is necessary, and the dummy-drive electrode 53 for fixing the nitride semiconductor layer 14 is also desired.

Furthermore, even in the case of forming the microlens 25, planarity is also desired, and the planarization portion 24 is preferably present. While the microlenses 25 are formed directly on the green wavelength conversion portion 23, the red wavelength conversion portion 22, and the transparent portion 21 in the present embodiment, a transparent resin layer may be interposed between the microlenses 25 and the green wavelength conversion portion 23, the red wavelength conversion portion 22, and the transparent portion 21 to reduce height variations among the green wavelength conversion portion 23, the red wavelength conversion portion 22, and the transparent portion 21 and also to reduce height differences between the planarization portion 24 and the green wavelength conversion portion 23, the red wavelength conversion portion 22, and the transparent portion 21. The step of exposing the I/O-electrode 54 in the peripheral region 4 including the I/O-electrode 54 is preferably after forming of the common N-electrode 56 or the green wavelength conversion portion 23, the red wavelength conversion portion 22, and the transparent portion 21.

Effect of Microlens 25

In the image display device 200 in which one edge of the pixel is 24 µm and the size of the sub-pixel is 8 µm×24 µm, the microlens 25 is disposed in each sub-pixel. The height of the microlens is approximately 4 µm. A sectional shape of the microlens seen from a short edge side of the sub-pixel is almost a semicircle.

Figure 4A:
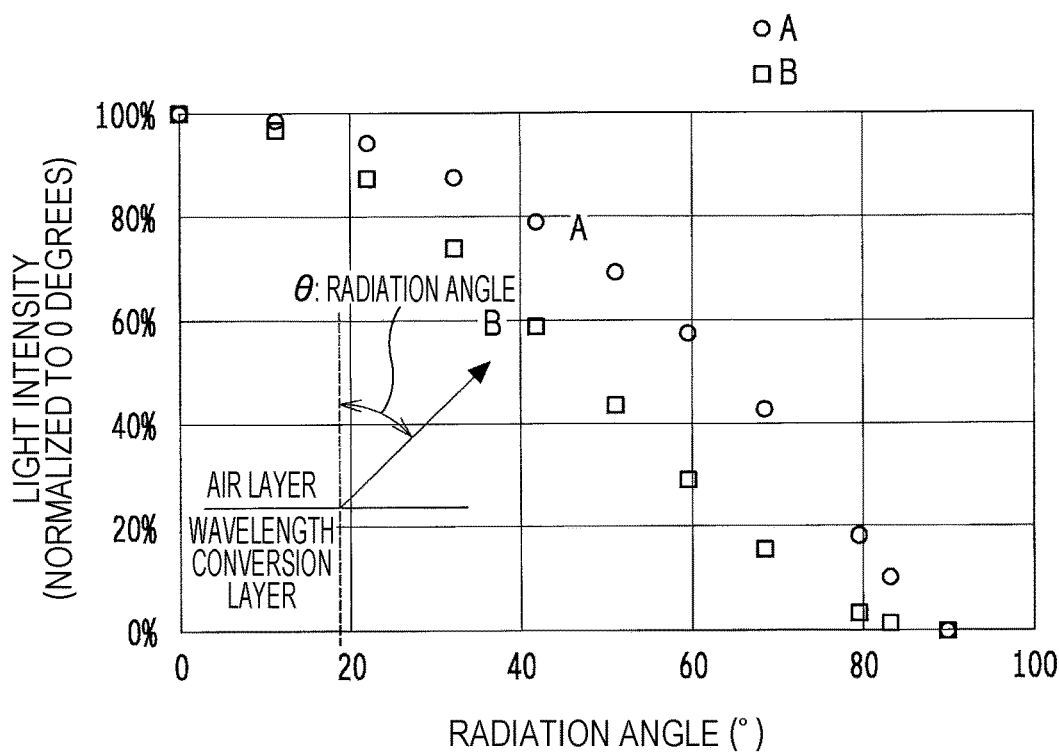
FIG. 4A is a graph illustrating a light distribution normalized to a light intensity at 0 degrees of the radiation angle of the image display device according to the first embodiment of the present disclosure.
Figure 4B:
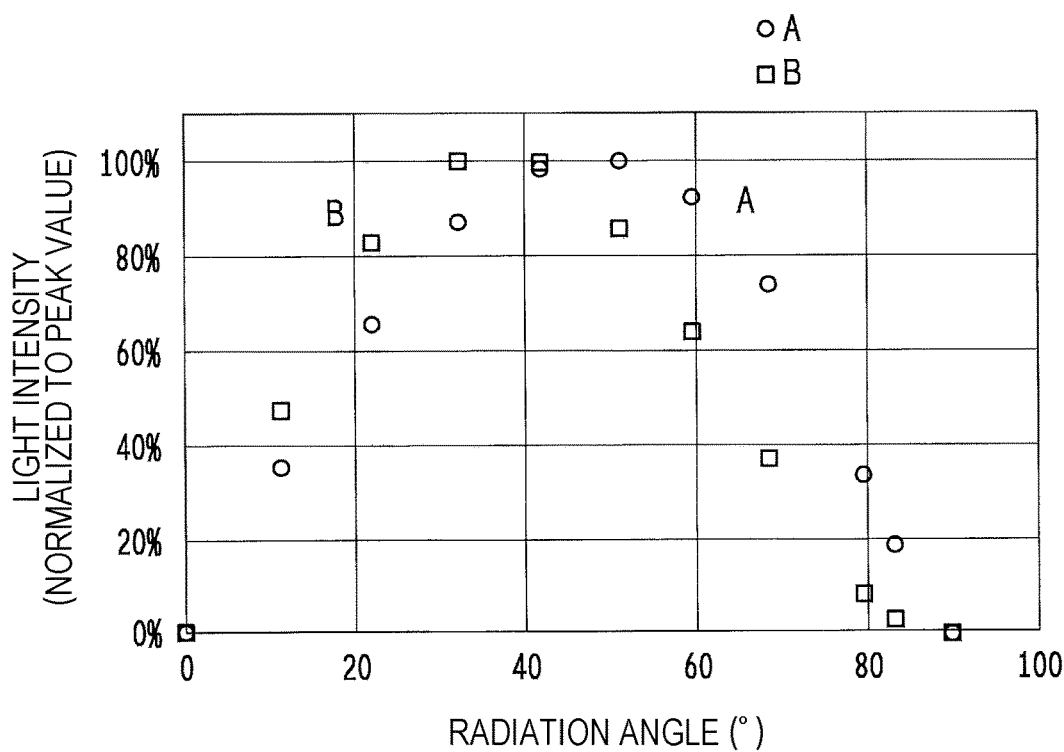
FIG. 4B is a graph illustrating a light distribution normalized to the peak value of the image display device according to the first embodiment of the present disclosure.

FIG. 4A is a graph illustrating a light distribution normalized to a light intensity at 0 degrees of the radiation angle θ of the image display device 200 according to the first embodiment of the present disclosure. FIG. 4B is a graph illustrating a light distribution normalized to the light intensity of the peak value of the image display device 200 according to the first embodiment of the present disclosure taking into account of the solid angle area.

Radiation angle dependency with respect to the green sub-pixel 8 is examined in a case (A) where the microlens 25 is not present, and a case (B) where the microlens 25 is present. As illustrated in FIG. 4A, the radiation angle θ is an angle formed by emitted light with respect to a line perpendicular to the surface of the image display device 200. In both (A) and (B), normalization to the light intensity at 0 degrees of the radiation angle θ is performed. FIG. 4B is a distribution in which the solid angle area is considered to the distribution in FIG. 4A, and normalization to the peak value is performed. It is understood that by the microlens 25, the light intensity distribution is narrowed, and more light is emitted near the perpendicular line. The integrated intensity of light emitted at the radiation angle θ from 0 degrees to 40 degrees is 43% of the total in the case of (A), and is 56% of the total in the case of (B) and is increased by approximately 30% compared to the case of (A). By arranging the microlens 25 in the green sub-pixel 8, the light distribution can be narrowed (convergence effect). Accordingly, for example, in the case of using the image display device 200 in a display such as a glass-type terminal or a HUD, more light can be converged with the same imaging optical element by using the microlens 25.

Almost the same effect is achieved in the case of the red sub-pixel 7. The effect of the blue sub-pixel 6 is even higher. The integrated intensity at the radiation angle θ of up to 40 degrees is increased by approximately 35% in a case where the microlens 25 is present than in a case where the microlens 25 is not present. The reason is considered to be such that the convergence performance of the microlens 25 is increased because the distance between the microlens 25 and the micro LED element 100B as a light source is increased. The focal length f (length measured below a lower side planar surface of the lens) of the microlens 25 can be approximated by f=R/(n-1) using a radius of curvature R and a refractive index n of the resin layer constituting the microlens 25 in a case where the surface of the microlens 25 is approximated to a spherical surface.

This approximation formula can be derived as followed. The focal length f of a spherical lens configured with a spherical surface having radii of curvature R1 and R2 is represented by the following lens maker's formula.

$$1/f=(n-1)\cdot(1/R1-1/R2)+d\cdot(n-1)^2/(n\cdot R1\cdot R2)$$

The refractive index of the lens material is denoted by n. The thickness of the lens is denoted by d. The radius of curvature on an incident side of light is denoted by R1. The radius of curvature on an emission side is denoted by R2. The focal length f is represented as being positive in the case of having a convex shape on the light incident side and being negative in the case of having a concave shape on the light incident side. In the microlens 25 having the shape in FIG. 1, in the case of R1=∞ and R2=-R, approximation of $1/f\approx(n-1)/R$ can be made.

Thus, the position of the focal point of the microlens 25 is considered to be in the transparent portion 21. The convergence performance of the lens is increased for the light impinging from lower portion below the focal point of the microlens 25. Thus, it is considered the convergence performance is increased in the blue sub-pixel 6. Conversely, the convergence performance is decreased for the light impinging from the lens side region above the focal point. The reason is considered to be such that in the case of the red sub-pixel 7 or the green sub-pixel 8, since the light source is the wavelength conversion portion, many light sources are included above the position of the focal point of the microlens 25, and the convergence performance is not sufficient.

While one sub-pixel is covered with one microlens 25 in the present embodiment, one sub-pixel may be covered with a plurality of microlenses. For example, in the present embodiment, three hemispherical microlenses each having a diameter of 8 µm may be lined up for one sub-pixel having a width of 24 µm.

As described above, by disposing the microlenses 25 (light convergence portion) on the green wavelength conversion portion 23, the red wavelength conversion portion 22, and the transparent portion 21 (light emission side), the light distribution of light emitted by each sub-pixel can be narrowed. Accordingly, the light intensity converged by the imaging optical element can be greatly increased. Accordingly, the display such as the glass-type terminal or the HUD in which the image display device 200 is used can perform brighter display or can reduce the power consumption to realize the same brightness.

While the nitride semiconductor layer 14 is used as a light source material in the present embodiment, for example, an AlInGaP-based compound semiconductor can be used in the case of red light single color display. The light source material is not limited to a nitride semiconductor. In a case where the wavelength conversion portion is not disposed at all in a pixel portion as in red light single color display, the transparent portion 21 may not be desired, and the light convergence portion may be disposed on the micro light-emission element. In addition, red light, green light, and blue light may be emitted using a nitride semiconductor such as GaN doped with a rare earth chemical element such as europium (Eu), erbium (Er), or thulium (Tm) as the light-emission layer 12 of each sub-pixel. In this case, the wavelength conversion portion is also not desired.

Second Embodiment

Figure 5:
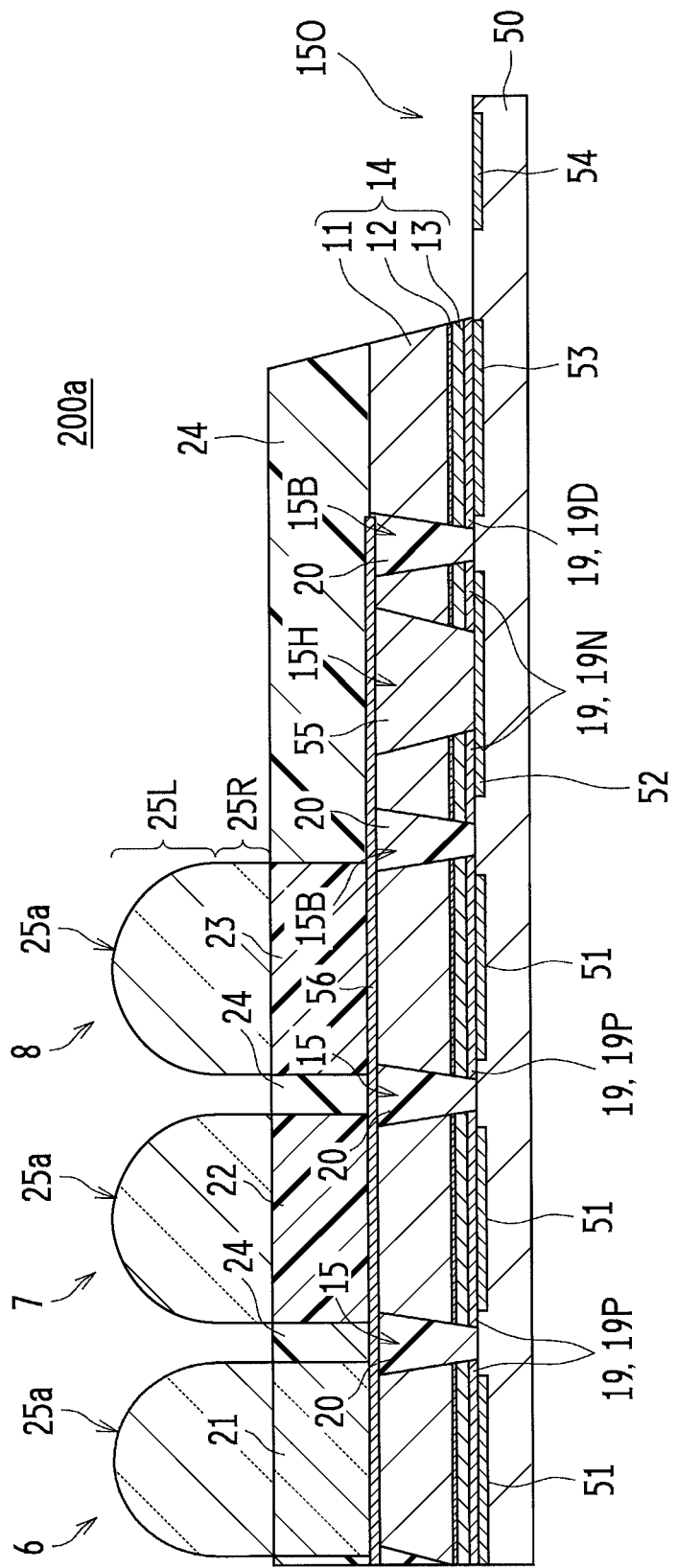
FIG. 5 is a sectional view of an image display device according to a second embodiment of the present disclosure.

A sectional view of an image display device 200a according to a second embodiment of the present disclosure is illustrated in FIG. 5. The image display device 200a according to the second embodiment is different from the image display device 200 according to the first embodiment in that the image display device 200a includes bullet-shaped microlenses 25a. Other points are not changed from the first embodiment. In the present embodiment, it is desirable to further increase the convergence efficiency by bringing the red sub-pixel 7 and the green sub-pixel 8 close to the situation of the blue sub-pixel 6 in the first embodiment.

As illustrated in FIG. 5, the bullet-shaped microlenses 25a have shapes in which pillar portions 25R that are almost pillar-shaped transparent resin layers are combined with lens portions 25L that are lens-shaped transparent resin layers. The microlenses 25a can be formed as follows. That is, first, the pillar portions 25R can be formed by transparent resin with less thermal deformation. Thermally fluidal transparent resin layers can be formed on the pillar portions 25R. The lens portions 25L can be formed by deforming the formed layers into lens shapes by heating. Alternatively, the pillar portion may be formed by forming the wavelength conversion portion and the pillar portion as a single body, precipitating the wavelength conversion particles, and leaving a supernatant part in the upper portion. Alternatively, the bullet-shaped microlens 25a may be formed by pressing a die that is processed to have a bullet array shape to the driving circuit substrate 50 on which the transparent resin is applied. Accordingly, the microlenses 25a can be formed. The plan view shapes of the pillar portions 25R are the same as the plan view shape of the sub-pixel, and the shapes can be changed depending on the shape of the sub-pixel.

In the bullet-shaped microlenses 25a having the present configuration, the distance between the part of the lens portions 25L having lens shapes and the light source can be increased by the pillar portions 25R. Accordingly, the convergence performance can be reinforced further than that in the first embodiment. Particularly, the positions of the focal points of the microlenses 25a are preferably on or above the surface of the wavelength conversion portion. The heights of the pillar portions 25R are preferably greater than or equal to R/(n−1). The pillar portions 25R having a height of 8 μm are added to the micro LED element 100 having the same configuration as the first embodiment without changing the lens shape. The total height is approximately 12 μm. In the present configuration, the integrated intensity up to the radiation angle of 40 degrees can be increased to 70% of the total.

According to the present configuration, the same effect as the first embodiment can be achieved.

Modification Example of Second Embodiment

Figure 6:
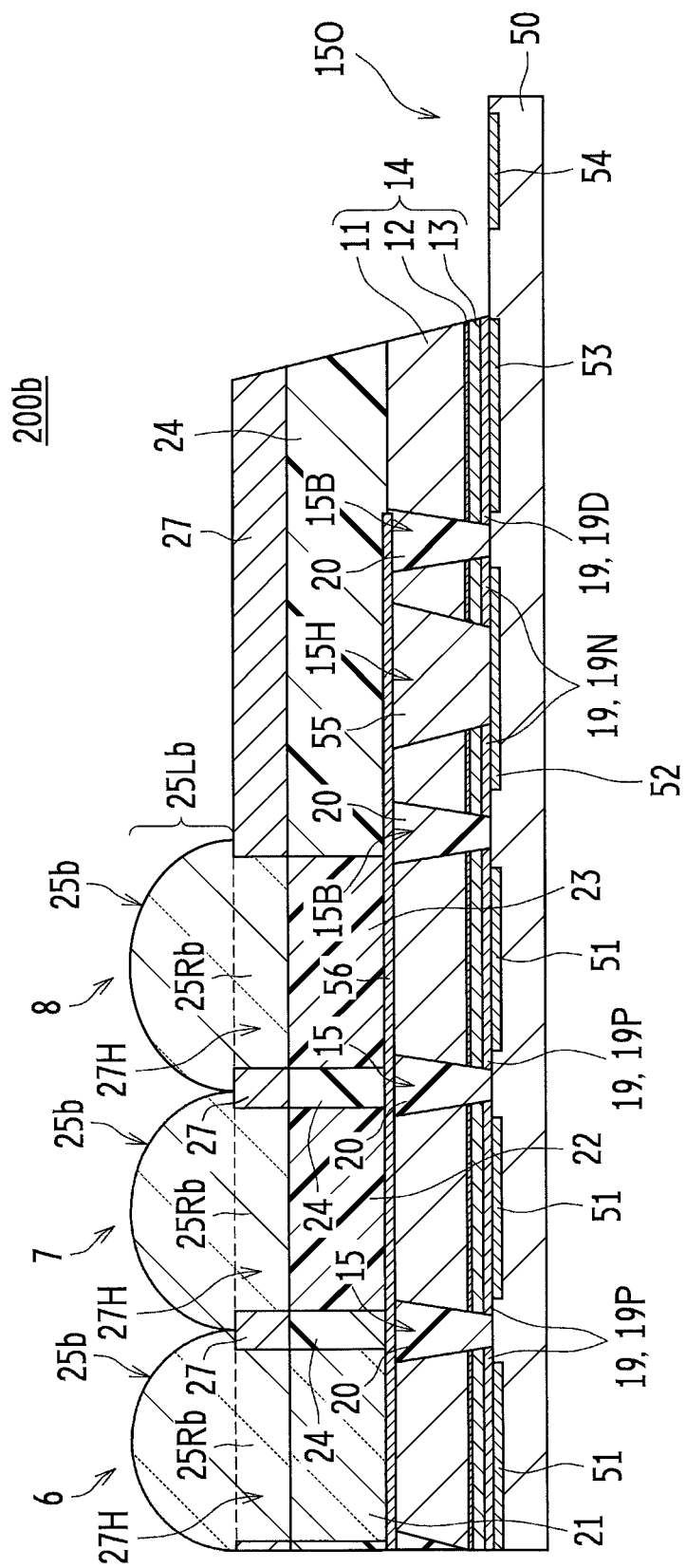
FIG. 6 is a sectional view of an image display device according to a modification example of the second embodiment of the present disclosure.

A sectional view of an image display device 200b according to a modification example of the second embodiment of the present disclosure is illustrated in FIG. 6. Microlenses 25b have shapes (rivet shapes) in which the diameters of pillar portions 25Rb are set to be smaller than the diameters of lens portions 25Lb. The intention of such a shape is the same as that of the bullet-shaped microlens. Other points are not changed from the image display device 200a according to the second embodiment.

In the present configuration, a buffer layer 27 including open regions 27H on the green wavelength conversion portion 23, the red wavelength conversion portion 22, and the transparent portion 21 is formed first. Then, the rivet-type microlenses 25b are formed by applying a microlens material, performing patterning, and then, providing fluidity by heating. Resin layers filling the open regions 27H of the buffer layer 27 play the roles of the pillar portions 25Rb. Parts that protrude upward from the buffer layer 27 become the lens portions 25Lb. The buffer layer 27 may be formed by transparent resin or may include a light absorbing material or a light reflection material or may be coated with a metal film in order for light not to leak to the adjacent sub-pixel. In addition, the buffer layer 27 may be a metal film. The shapes of the open regions 27H are the same as the plan view shape of the sub-pixel. The shapes can be changed depending on the shape of the sub-pixel.

According to the present configuration as well, the same effect as the second embodiment can be achieved.

Third Embodiment

Figure 7:
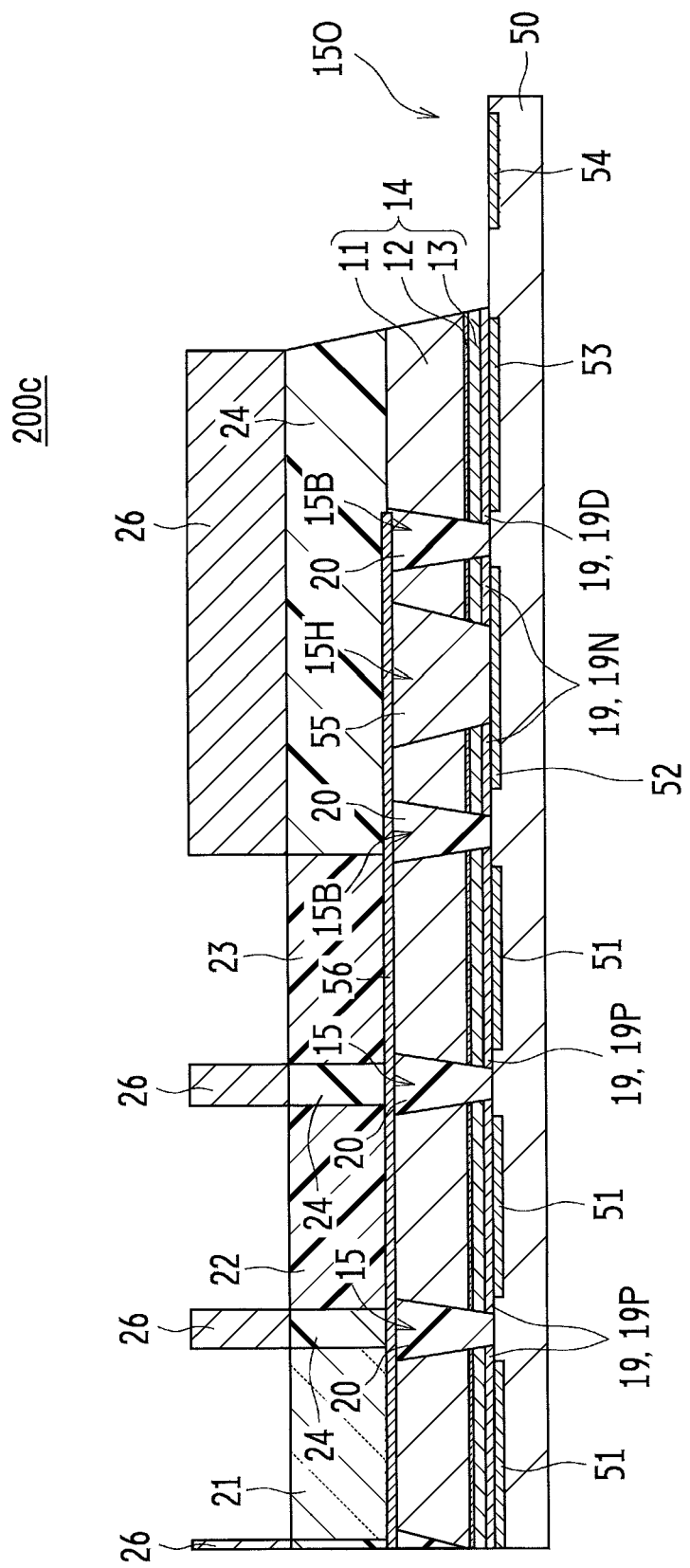
FIG. 7 is a sectional view of an image display device according to a third embodiment of the present disclosure.

A sectional view of an image display device 200c according to a third embodiment of the present disclosure is illustrated in FIG. 7. The image display device 200c according to the third embodiment of the present disclosure is different from the image display device 200 according to the first embodiment in that the microlenses 25 as the light convergence portion are replaced with reflection walls 26. While the light distribution of radiated light is narrowed by refraction in the first embodiment, the light distribution is narrowed (converged) by reflection in the present embodiment. Configurations of the green wavelength conversion portion 23, the red wavelength conversion portion 22, the transparent portion 21, and the planarization portion 24 and components positioned lower than them are not changed from the first embodiment. The difference is that the reflection walls 26 are arranged for each sub-pixel instead of the microlenses 25. Each sub-pixel can be surrounded by the reflection walls 26. By doing so, light that is radiated at a large radiation angle from each sub-pixel can be blocked, and the radiation angle of light can be changed. Accordingly, light at a large radiation angle can be reduced, and the light distribution can be narrowed. The reflection walls 26 are rectangular walls that are almost perpendicular to the green wavelength conversion portion 23, the red wavelength conversion portion 22, the transparent portion 21, and the planarization portion 24. As illustrated in FIG. 7, the reflection wall 26 is preferably arranged on only the planarization portion 24. In a case where the bottom portion of the reflection wall 26 protrudes from the planarization portion 24 and covers the transparent portion 21, the green wavelength conversion portion 23, and the red wavelength conversion portion 22, light is blocked, and light emission efficiency is decreased. Thus, such a case is not preferable.

According to the present configuration as well, the same effect as the first embodiment can be achieved.

Modification Example of Third Embodiment

Figure 8:
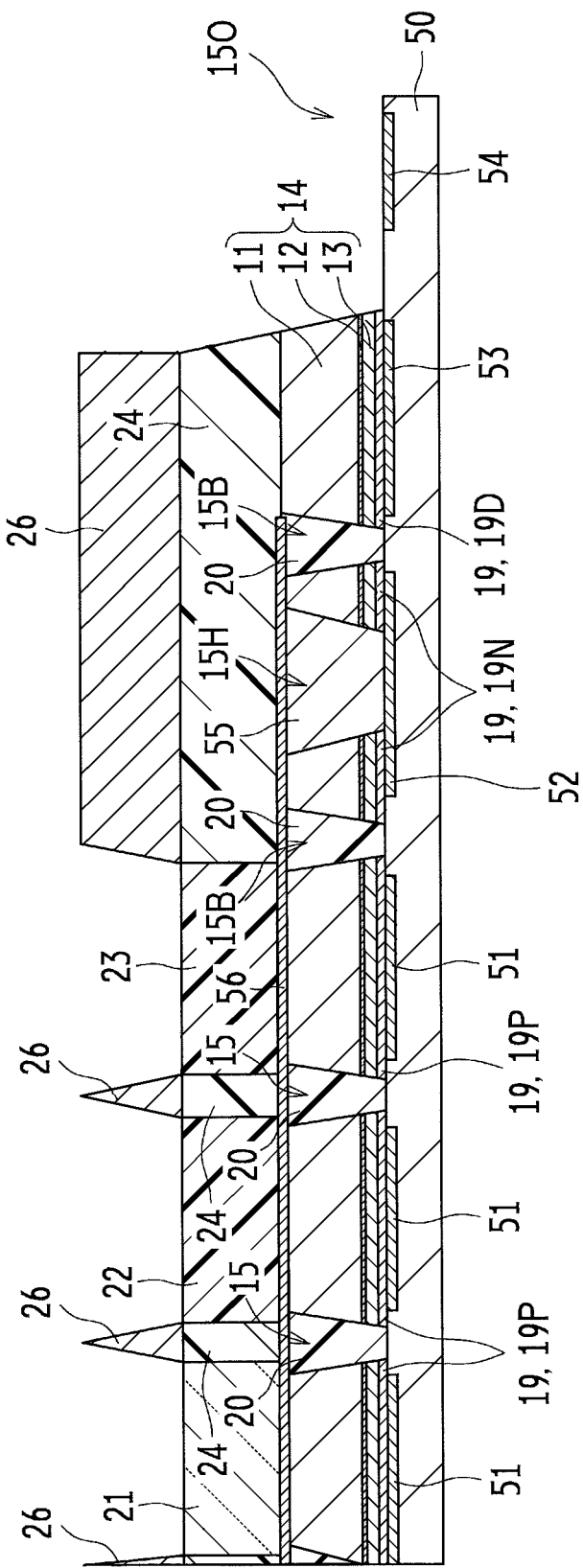
FIG. 8 is a sectional view of an image display device according to a modification example of the third embodiment of the present disclosure.

A sectional view of an image display device 200d according to a modification example of the third embodiment of the present disclosure is illustrated in FIG. 8. In the image display device 200c according to the third embodiment, the reflection wall 26 is a rectangular wall that is almost perpendicular to the green wavelength conversion portion 23, the red wavelength conversion portion 22, the transparent portion 21, and the planarization portion 24. However, the sectional shape of the reflection wall 26 does not have to be a rectangle. In the image display device 200d according to the modification example of the third embodiment, the reflection walls 26 have inclined portions of which the widths are decreased in a direction to the side opposite to the driving circuit substrate 50 as illustrated in FIG. 8. The inclined portion may have a recessed surface shape.

Fourth Embodiment

Figure 9:
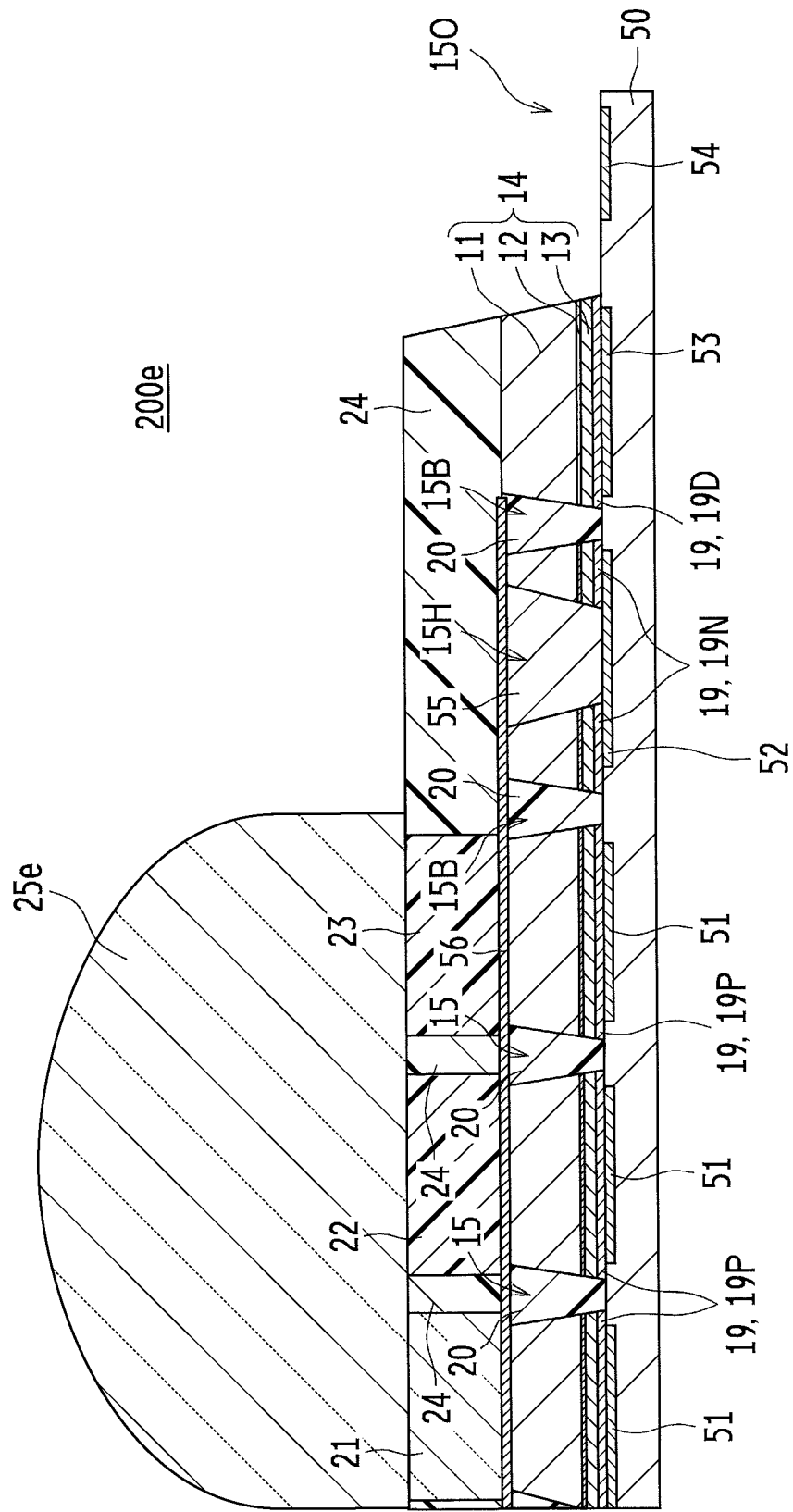
FIG. 9 is a sectional view of an image display device according to a fourth embodiment of the present disclosure.

A sectional view of an image display device 200e according to a fourth embodiment of the present disclosure is illustrated in FIG. 9. The image display device 200e according to the fourth embodiment is different from the image display device 200 according to the first embodiment in that the pixel 5 includes one microlens 25e without arranging the individual microlenses 25 for each sub-pixel (the blue sub-pixel 6, the red sub-pixel 7, and the green sub-pixel 8). Other points are not changed from the first embodiment.

In a case where a minute pixel is used, it may not be easy to arrange a high effect microlens for individual sub-pixels. In such a case, the microlens 25e can be arranged in the whole pixel 5 as in the present embodiment.

The shape of the microlens 25e may be a hemispherical shape as in the first embodiment, a bullet shape as in the second embodiment, or a rivet shape as in the modification example of the second embodiment.

According to the present configuration as well, the same effect as the first embodiment can be achieved.

Fifth Embodiment

Figure 10:
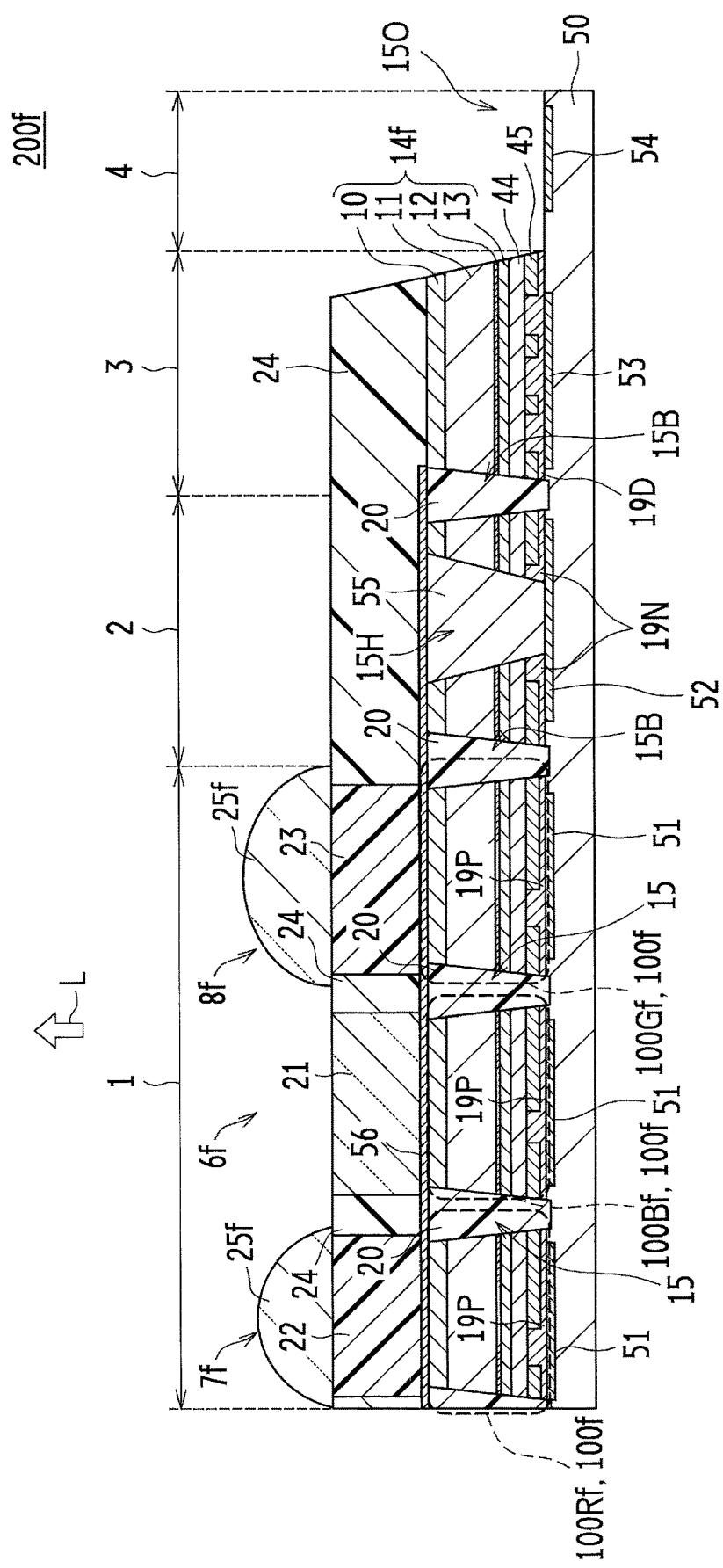
FIG. 10 is a sectional view of an image display device according to a fifth embodiment of the present disclosure.
Figure 11:
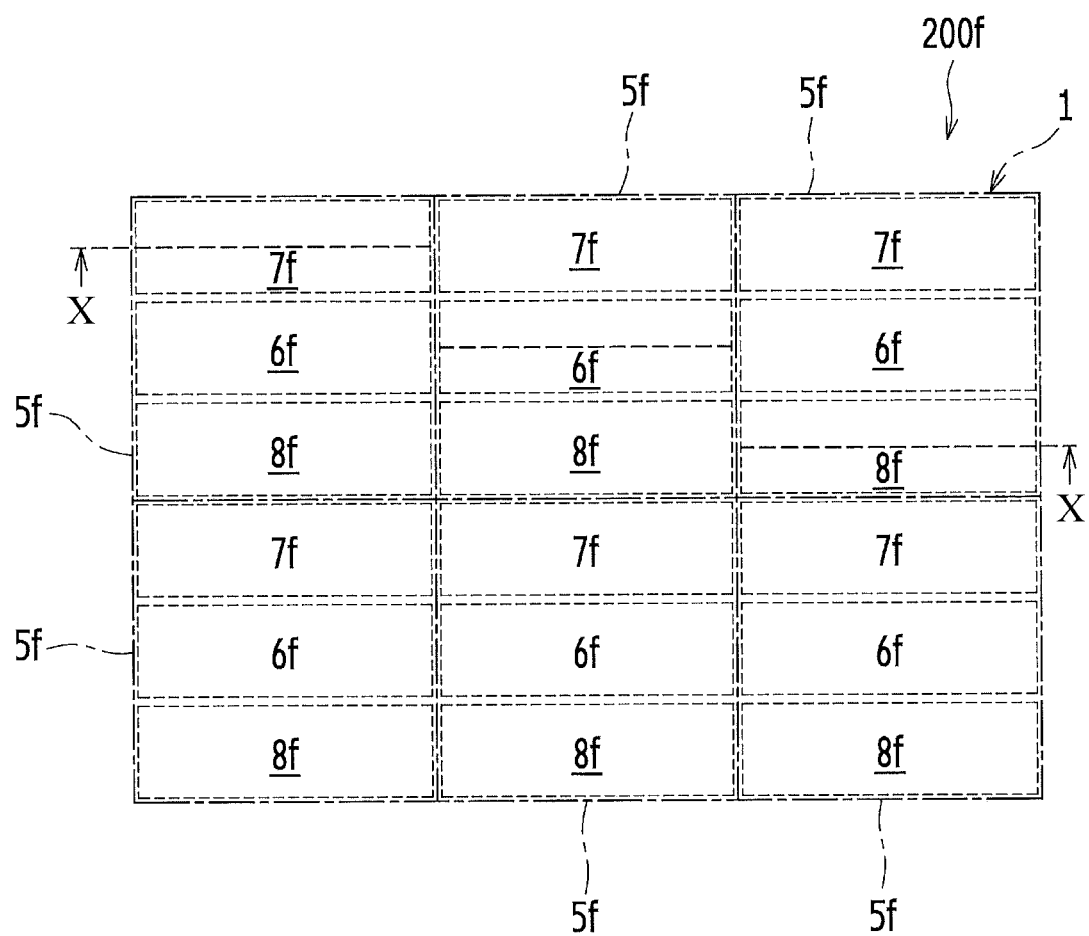
FIG. 11 is a top view of a pixel region of the image display device according to the fifth embodiment of the present disclosure.

A sectional view of an image display device 200f according to a fifth embodiment of the present disclosure is illustrated in FIG. 10. A top view of the pixel region 1 of the image display device 200f according to the fifth embodiment of the present disclosure is illustrated in FIG. 11. The present embodiment is different from the first embodiment in that a vertical cavity surface emitting laser (VCSEL)-type micro laser element that is another example of the micro light-emission element is arranged instead of the micro LED element 100, microlenses 25f are arranged on only the green wavelength conversion portion 23 and the red wavelength conversion portion 22, and a blue sub-pixel 6f is disposed in the center portion of a pixel 5f. Other points are not changed.

As illustrated in a plan view of the pixel region 1 in FIG. 11, the blue sub-pixel 6f is arranged in the center portion, and a red sub-pixel 7f and a green sub-pixel 8f are arranged on both sides of the blue sub-pixel 6f. The arrangement pattern of the sub-pixels can be appropriately changed depending on application and the like. FIG. 10 represents a section of X-X line part illustrated in FIG. 11.

As illustrated in the sectional view of FIG. 10, the micro LED elements 100B, 100R, and 100G illustrated in FIG. 1 are replaced with VCSEL-type micro laser elements 100Bf, 100Rf, and 100Gf (100f). Accordingly, the light source emits blue light having high directivity. Thus, with respect to blue light, convergence may not be desired, and the microlens can be omitted. However, with respect to the green wavelength conversion portion 23 and the red wavelength conversion portion 22, green light and red light generated by wavelength conversion are not likely to have directivity. Accordingly, the micro laser elements 100Rf and 100Gf preferably include the microlenses 25f in the same manner as the first embodiment.

The micro laser elements 100Bf, 100Rf, and 100Gf are different from the micro LED elements 100B, 100R, and 100G in that a first reflection layer 10 is included on the light emission side, and a transparent electrode layer 44 and a second reflection layer 45 are included on a side of driving circuit substrate 50.

One example of a manufacturing method for the micro laser elements 100Bf, 100Rf, and 100Gf will be described below with reference to FIG. 12A to FIG. 12F. Each of FIG. 12A to FIG. 12F is a sectional view illustrating first to sixth manufacturing steps for the micro LED element 100f and the image display device 200f.

Figure 12A:
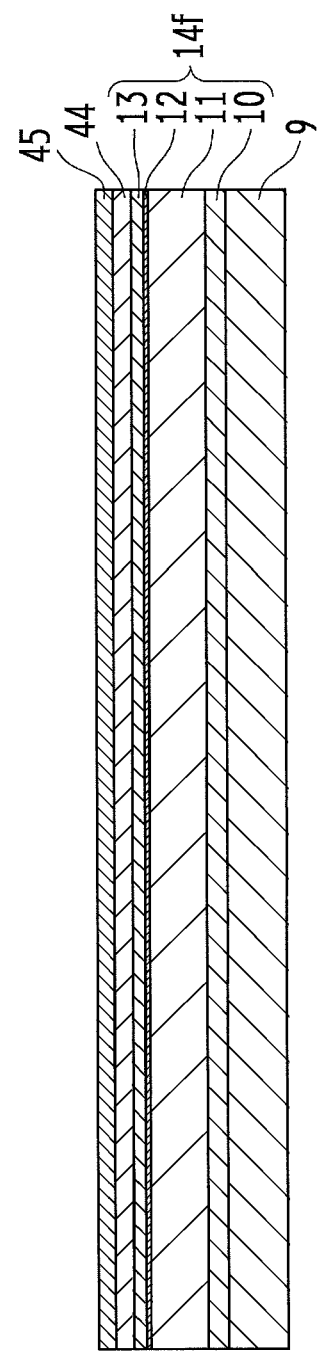
FIG. 12A is a sectional view illustrating a first manufacturing step for the image display device according to the fifth embodiment of the present disclosure.

As illustrated in FIG. 12A, a nitride semiconductor layer 14f is formed by depositing the first reflection layer 10, the N-side layer 11, the light-emission layer 12, and the P-side layer 13 in this order on the growth substrate 9. The first reflection layer 10 is a distributed Bragg reflector (DBR) that reflects blue light. The first reflection layer 10 can be formed by stacking a plurality of pairs of an AlxGa(1−x)N layer and a GaN layer. For example, 20 layers of GaN/AlGaN pairs each having a total thickness of 93 nm including a-46 nm GaN layer and a 47-nm AlxGa(1−x)N layer are included, and the total thickness is approximately 1.8 µm.

Furthermore, the transparent electrode layer 44 and the second reflection layer 45 are deposited on the nitride semiconductor layer 14f. The transparent electrode layer 44 is an electrode layer of indium tin oxide (ITO) or the like and has a thickness of approximately 50 nm to 600 nm. The second reflection layer 45 is a DBR including a dielectric multilayer film. For example, 10 layers of pairs of a $TiO_2$ thin film (having a thickness of 36 nm) and a $SiO_2$ thin film (having a thickness of 77 nm) are included, and the whole thickness is approximately 1.1 µm. The reflectance of the second reflection layer 45 with respect to blue light is higher than the reflectance of the first reflection layer 10.

Figure 12C:
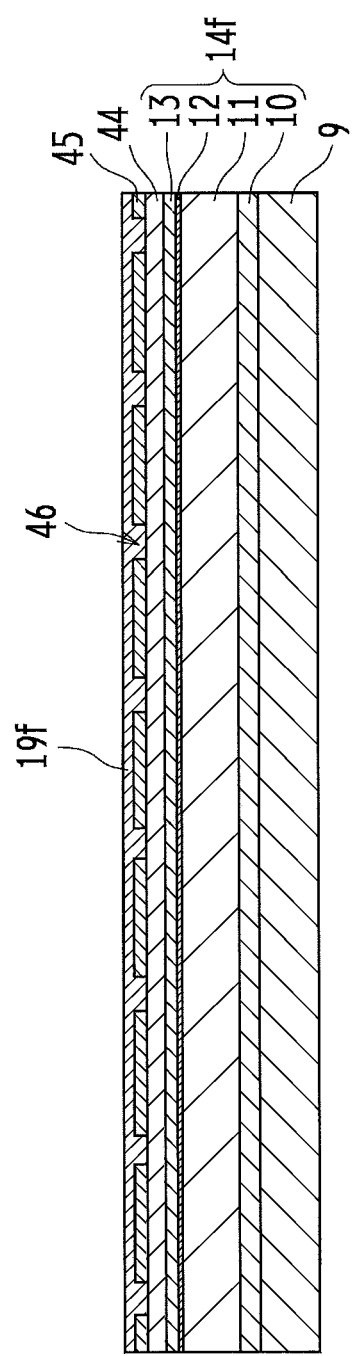
FIG. 12C is a sectional view illustrating a third manufacturing step for the image display device according to the fifth embodiment of the present disclosure.
Figure 12D:
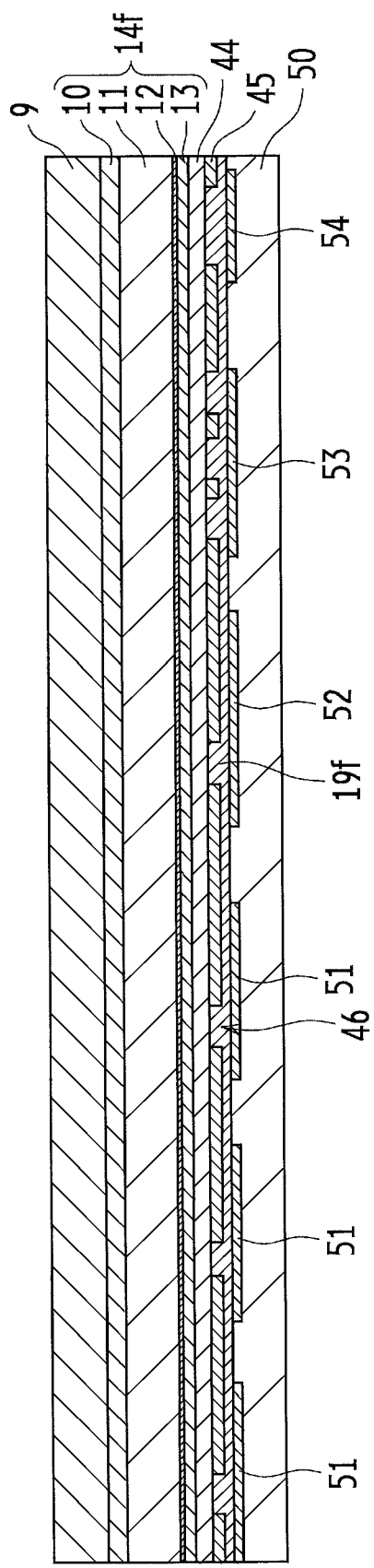
FIG. 12D is a sectional view illustrating a fourth manufacturing step for the image display device according to the fifth embodiment of the present disclosure.
Figure 12E:
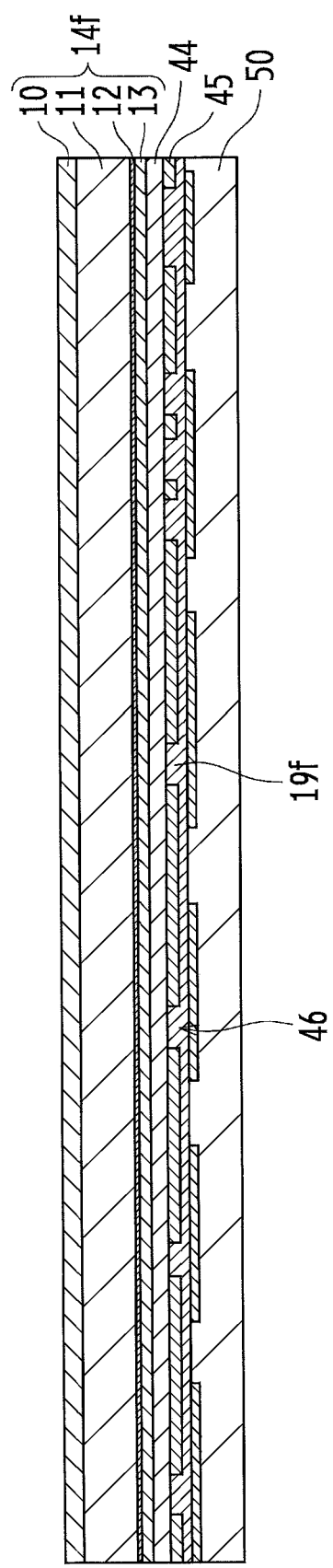
FIG. 12E is a sectional view illustrating a fifth manufacturing step for the image display device according to the fifth embodiment of the present disclosure.

As illustrated in FIG. 12B, after the second reflection layer 45 is stacked, open regions 46 are formed using photolithography technology and dry etching technology. The transparent electrode layer 44 is exposed in the bottom portions of the open regions 46. At least one open region is formed for every sub-pixels in the pixel region 1, and it is preferable to have more open regions for the common interconnection region 2, the dummy region 3, and the peripheral region 4, as shown in FIG. 12D. Next, as illustrated in FIG. 12C, a P-electrode layer 19f is formed. The P-electrode layer 19f preferably includes a plug part filling the open regions 46. A planar film part covering a planar surface portion is preferably included but can be omitted. Next, steps of bonding of the growth substrate 9 to the driving circuit substrate 50 as illustrated in FIG. 12D and peeling the growth substrate 9 as illustrated in FIG. 12E are the same as those of the first embodiment.

In forming of the pixel isolation trench 15, the boundary trench 15B, the common electrode contact hole 15H, and the exposed region 15O illustrated in FIG. 12F, the nitride semiconductor layer 14f, the transparent electrode layer 44, the second reflection layer 45, and the P-electrode layer 19f are etched in order. Other points are the same as the first embodiment. The subsequent steps are substantially the same as the steps illustrated in FIG. 3F to FIG. 3O of the first embodiment. The image display device 200f illustrated in FIG. 10 is formed.

According to the present configuration as well, the same effect as the first embodiment can be achieved.

Sixth Embodiment

Figure 13:
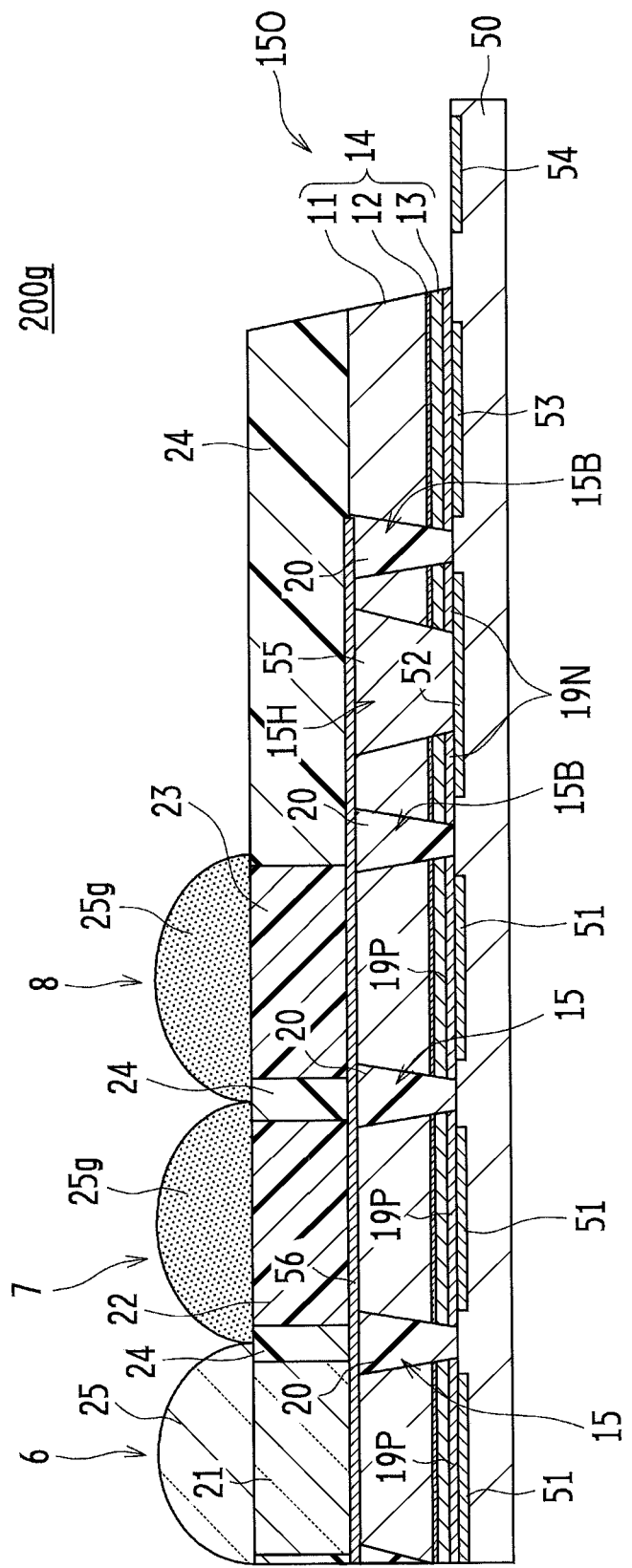
FIG. 13 is a sectional view of an image display device according to a sixth embodiment of the present disclosure.

A sectional view of an image display device 200g according to a sixth embodiment of the present disclosure is illustrated in FIG. 13. The image display device 200g according to the sixth embodiment is different from the image display device 200 according to the first embodiment in that microlenses 25g arranged in the red sub-pixel 7 and the green sub-pixel 8 have a function of absorbing blue light.

The red sub-pixel 7 and the green sub-pixel 8 may emit blue light that is excitation light. Such a leakage of blue light occurs in a case where the thickness of the wavelength conversion portion is not sufficiently large for absorbing blue light. Such a phenomenon poses a problem in that the color purity of red light and green light is degraded. As illustrated in FIG. 13, the microlenses 25g that have a function of absorbing blue light are arranged on the red sub-pixel 7 and the green sub-pixel 8 in which blue light leaks. By doing so, blue light leaking from the wavelength conversion portion can be reduced, and color purity can be improved. For example, the microlenses 25g can be formed by bonding dye molecules absorbing blue light to a thermally fluidal transparent resin base material. For example, in a case where blue light does not leak in the red sub-pixel 7, the microlens 25g can be arranged on only the green sub-pixel 8. For the blue sub-pixel 6, the function of absorbing blue light is not desired, and thus, the same microlens 25 as the first embodiment is arranged.

In the image display device 200g of the present configuration, the microlens 25 and the microlenses 25g are applied and patterned sequentially. Then, heating is applied to deform them due to fluidity. By doing so, processing into a lens shape can be performed.

According to the present configuration, the same effect as the first embodiment can be achieved, and an additional effect such as inhibiting degradation of color purity can also be achieved.

Modification Example of Sixth Embodiment

Figure 14:
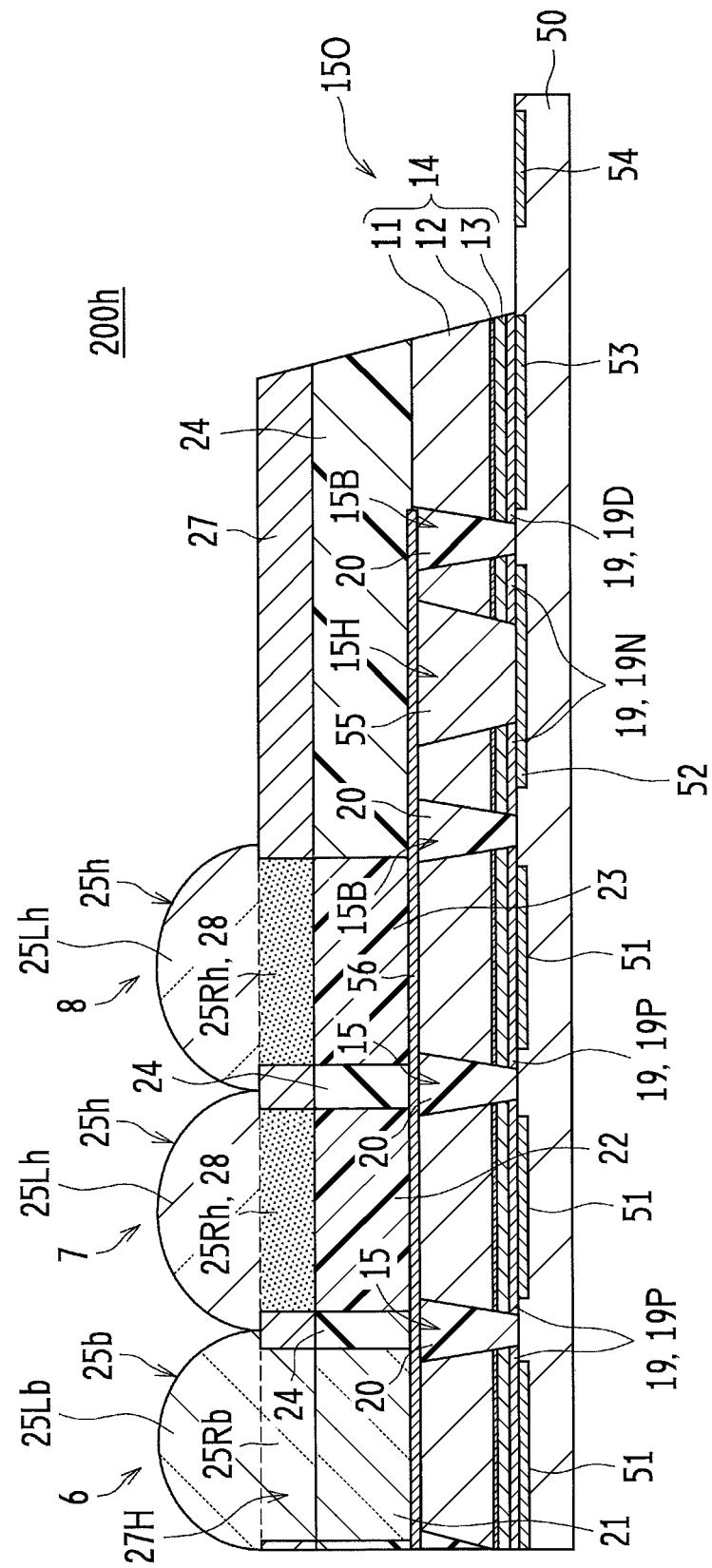
FIG. 14 is a sectional view of an image display device according to a modification example of the sixth embodiment of the present disclosure.

A sectional view of an image display device 200h according to a modification example of the sixth embodiment of the present disclosure is illustrated in FIG. 14. The same effect as the sixth embodiment can also be implemented by the image display device 200h illustrated in FIG. 14. In the image display device 200h, pillar portions 25Rh in microlenses 25h of the red sub-pixel 7 and the green sub-pixel 8 in the image display device 200b illustrated in FIG. 6 are configured with a blue light absorbing filter 28 (color filter) that absorbs blue light. Lens portions 25Lh in the microlenses 25h are configured with transparent resin that does not absorb blue light. There is no change from the image display device 200b with respect to the blue sub-pixel 6. The whole microlens does not have to have the color filter function. A part of the microlens may have the color filter function in a case where the leakage of blue light can be inhibited to a predetermined intensity or lower.

While blue light may not be absorbed by a scattering material in the sixth embodiment, a scattering color filter material can be used in the present modification example.

According to the present configuration, the same effect as the first embodiment can be achieved, and an additional effect such as inhibiting degradation of color purity can also be achieved.

Seventh Embodiment

Figure 15:
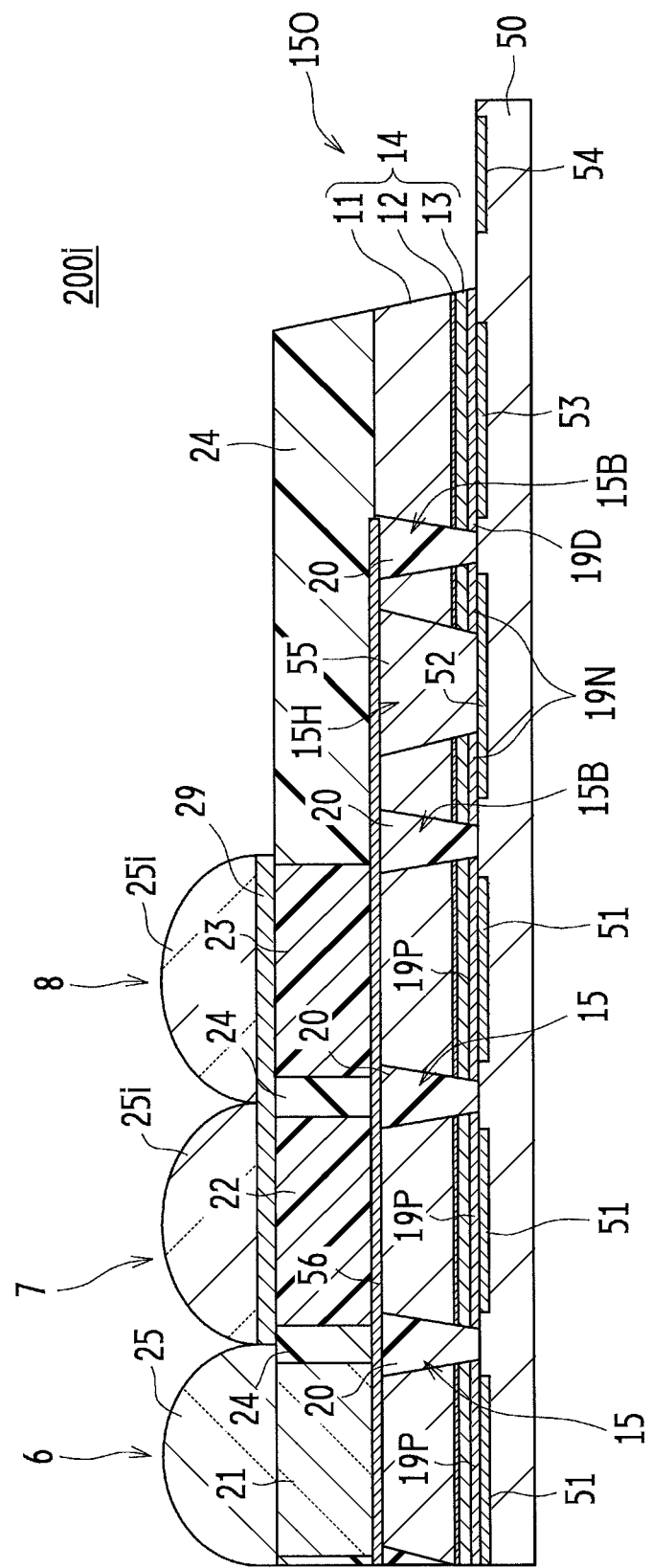
FIG. 15 is a sectional view of an image display device according to a seventh embodiment of the present disclosure.

A sectional view of an image display device 200i according to a seventh embodiment of the present disclosure is illustrated in FIG. 15. The image display device 200i according to the seventh embodiment of the present disclosure is different from the image display device 200 according to the first embodiment in that microlenses 25i and a blue light reflection layer 29 are arranged in the red sub-pixel 7 and the green sub-pixel 8 as illustrated in FIG. 15.

By arranging the blue light reflection layer 29, the red wavelength conversion portion 22 and the green wavelength conversion portion 23 can be thinned. In addition, the aspect ratio of the wavelength conversion portion can be decreased. Accordingly, minute pixels can be easily implemented. The microlenses 25i are not changed from the microlenses 25 of the first embodiment but preferably cover the blue light reflection layer 29 completely.

The blue light reflection layer 29 almost does not transmit blue light (transmittance is smaller than or equal to 10%), has very high reflectance, and has transmissivity with respect to visible light having a wavelength of greater than or equal to 480 nm. One example is a DBR including a dielectric multilayer film and has a configuration similar to the second reflection layer 45 illustrated in FIG. 12A. Since most of blue light that excites the wavelength conversion portion can be reflected, the reflected blue light passes through the wavelength conversion portion again. Accordingly, the thickness of the wavelength conversion portion desired for wavelength conversion of most of blue light can be decreased to at least half. The red light and green light after wavelength conversion are transmitted through the blue light reflection layer 29 and are converged by the microlenses 25i. Since the distance between the lens and the wavelength conversion portion is increased by adding the blue light reflection layer 29, the convergence effect can be increased.

According to the present configuration, the same effect as the first embodiment can be achieved, and an additional effect such as thinning the wavelength conversion portion can also be achieved.

Modification Example of Seventh Embodiment

Figure 16:
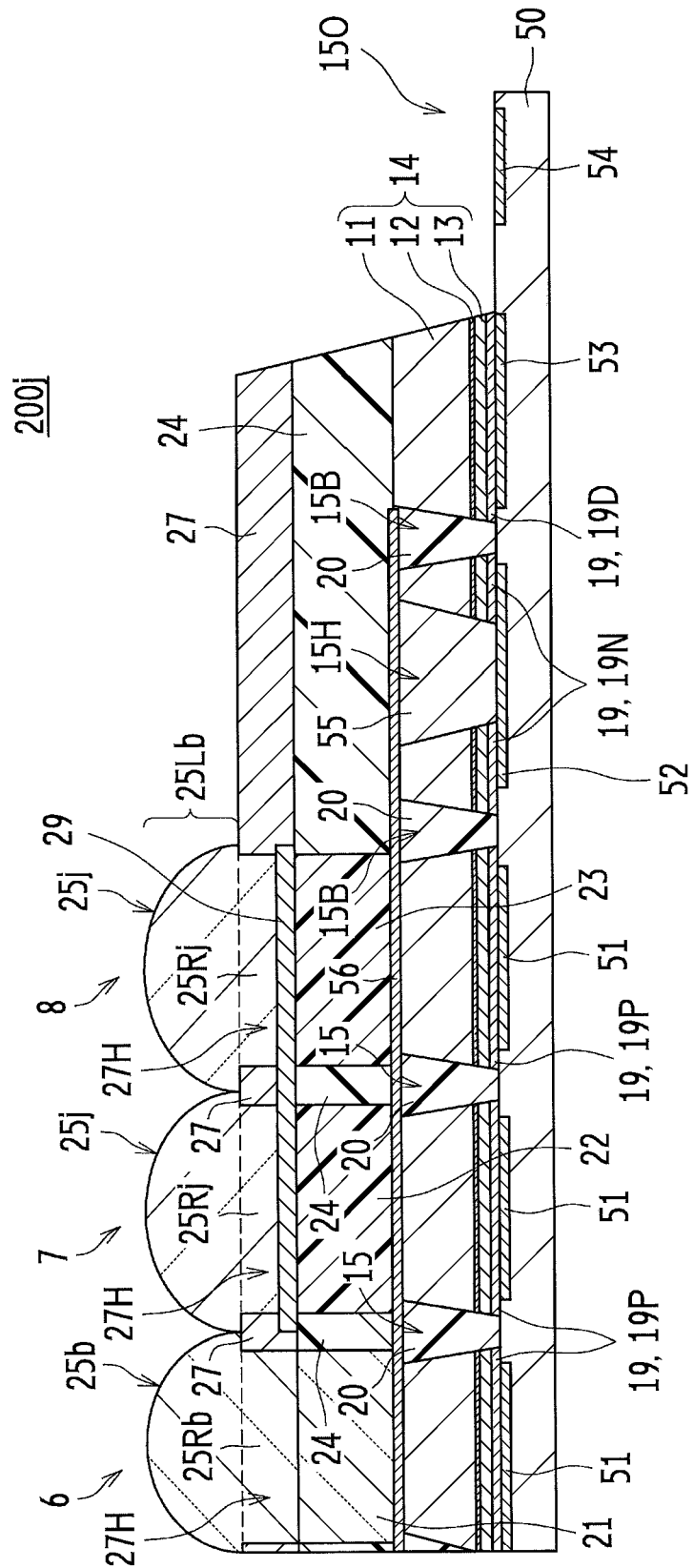
FIG. 16 is a sectional view of an image display device according to a modification example of the seventh embodiment of the present disclosure.

A sectional view of an image display device 200j according to a modification example of the seventh embodiment of the present disclosure is illustrated in FIG. 16. The same effect as the seventh embodiment can also be implemented by the image display device 200j illustrated in FIG. 16. The image display device 200j has a configuration in which the pillar portions 25Rb in the microlenses 25b of the red sub-pixel 7 and the green sub-pixel 8 in the image display device 200b illustrated in FIG. 6 are set as pillar portions 25Rj in microlenses 25j, and the blue light reflection layer 29 is arranged in the part of the pillar portions 25Rj.

According to the present embodiment, the light output can be improved in the image display device 200j.

Eighth Embodiment

Figure 17:
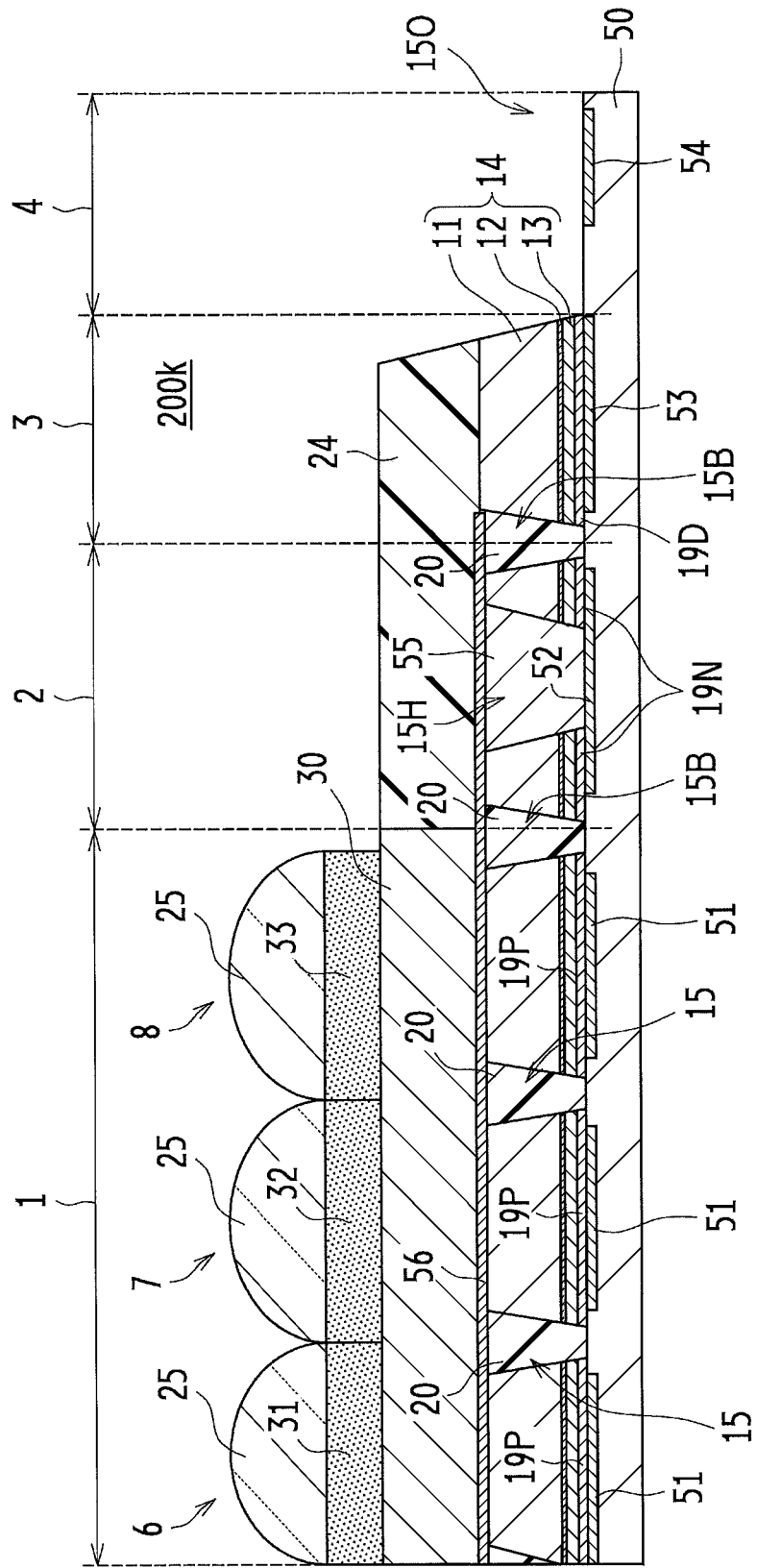
FIG. 17 is a sectional view of an image display device according to an eighth embodiment of the present disclosure.

A sectional view of an image display device 200k according to an eighth embodiment of the present disclosure is illustrated in FIG. 17. The image display device 200k according to the eighth embodiment of the present disclosure is different from the image display device 200 according to the first embodiment in that the green wavelength conversion portion 23, the red wavelength conversion portion 22, and the transparent portion 21 are not included, a yellow wavelength conversion portion 30 is included in the whole pixel, and color filters for each of blue, green, and red are included. Other points are not changed from the first embodiment.

As illustrated by the image display device 200*k* in FIG. 17, the yellow wavelength conversion portion 30 is formed in the whole pixel region 1. The yellow wavelength conversion portion 30 is excited by blue light, emits yellow light, and emits white light as a whole. In the blue sub-pixel 6, the red sub-pixel 7, and the green sub-pixel 8, a blue color filter 31, a red color filter 32, and a green color filter 33 are respectively arranged and respectively emits blue light, red light, and green light.

YAG phosphor minute particles can be used in the yellow wavelength conversion portion 30. The YAG phosphor has higher stability than quantum dots and can be used at a relatively high temperature. Accordingly, the image display device 200*k* can be operated with higher power than devices in which quantum dots or other phosphor materials are used. The present configuration is a configuration useful in a case where high light output is desired.

In the present configuration, only the yellow wavelength conversion portion 30 is formed as a wavelength conversion portion. Thus, the manufacturing step is very simple. In addition, the wavelength conversion portion does not have to be processed for each pixel, and color filter technology that is generally used can be used. Thus, the manufacturing step is technically easy. The effect of narrowing the light distribution by the microlenses 25 is effective. The blue color filler 31, the red color filter 32, and the green color filter 33 preferably do not have or almost do not have a scattering ability. In that case, the effect of narrowing the light distribution can be reinforced by each color filter that plays the same role as the pillar portion of the microlens.

According to the present embodiment, the same effect as the first embodiment can be achieved.

Ninth Embodiment

Figure 18:
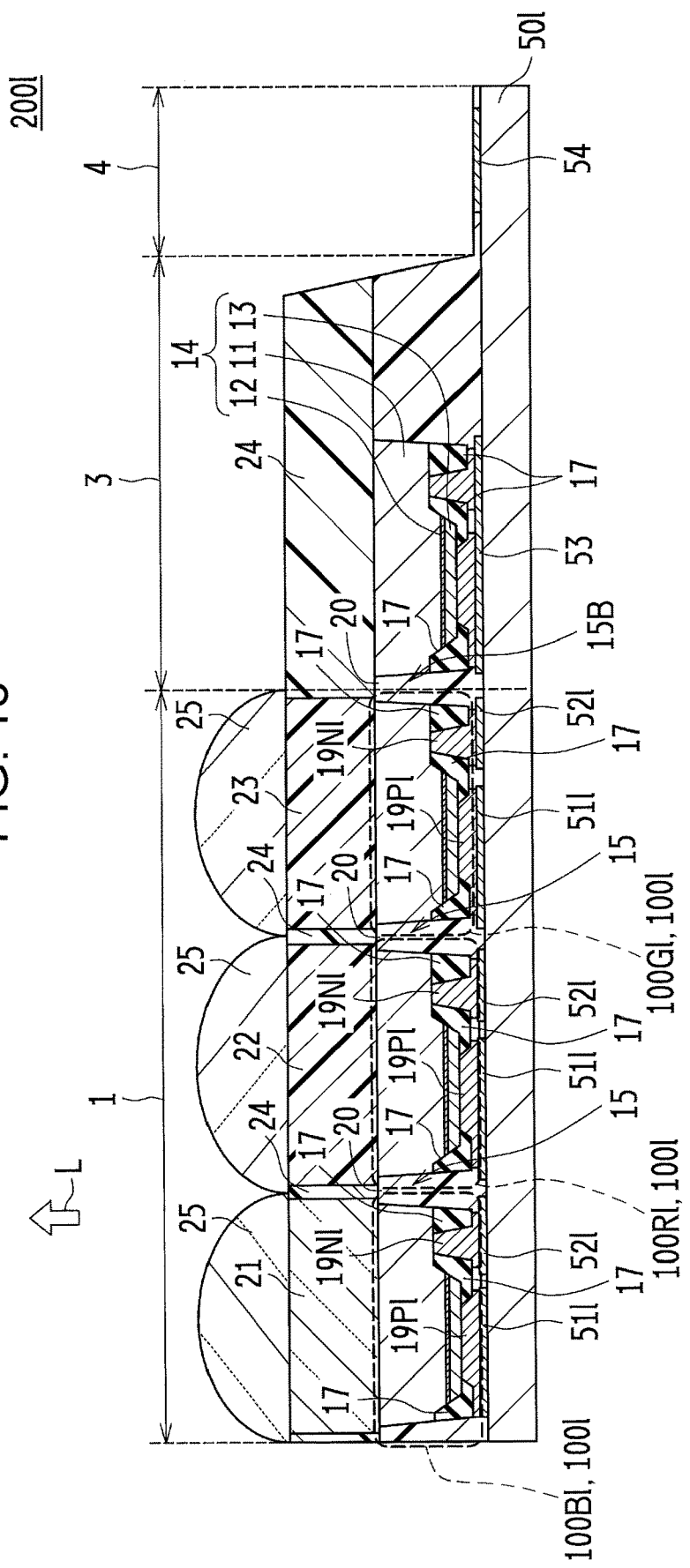
FIG. 18 is a sectional view of an image display device according to a ninth embodiment of the present disclosure.

A sectional view of an image display device 200*l* according to a ninth embodiment of the present disclosure is illustrated in FIG. 18. The image display device 200*l* according to the ninth embodiment of the present disclosure is different from the image display device 200 according to the first embodiment in terms of a micro LED element 100*l* (collectively refers to a micro LED element 100Bl, a micro LED element 100Rl, and a micro LED element 100Gl). Other points are not changed from the image display device 200 according to the first embodiment. While the micro LED element 100 according to the first embodiment includes the P-electrode 19P on the side of the driving circuit substrate 50 and the common N-electrode 56 on the light emission side (a so-called top-bottom electrode type), the micro LED element 100*l* of the present embodiment has a configuration in which both P and N electrodes are included on a single side surface.

As illustrated in FIG. 18, the micro LED element 100*l* includes P-electrodes 19Pl and N-electrodes 19Nl on a side of a driving circuit substrate 50*l*. P-drive electrodes 51*l* and N-drive electrodes 52*l* are arranged for each sub-pixel in the driving circuit substrate 50*l*. The P-drive electrodes 51*l* and the N-drive electrodes 52*l* are respectively connected to the P-electrodes 19Pl and the N-electrodes 19Nl. In the micro LED element 100*l*, a predetermined current flows, and light emission is controlled. Such a configuration has an advantage such that the manufacturing step for the common N-electrode 56 in the micro LED element 100 according to the first embodiment can be omitted in the manufacturing step for the image display device 200*l*, and manufacturing is easy. For example, the micro LED element 100*l* is appropriate for application of a display such as a head-up display or a projector for which high power is requested. The N-electrode 19Nl does not have to be disposed for each micro LED element 100*l*. A plurality of micro LED elements 100*l* may share one N-electrode 19Nl.

According to the image display device 200*l* in this embodiment, while the micro LED element 100*l* is different, the effect of the microlens 25 is the same as that of the first embodiment, and the light distribution of light emitted by each sub-pixel can be narrowed. Accordingly, the intensity of light that can be converged by the imaging optical element, which projects the image formed by the image display device 200*l*, can be greatly increased. Accordingly, a display (for example, a projection display) in which the image display device 200*l* is used can perform brighter display. Alternatively, at the same brightness, power consumption can be reduced more. In FIG. 18, reference sign 17 denotes a protection film.

Manufacturing Method

Next, one example of a manufacturing method for the micro LED element 100*l* will be described with reference to FIG. 19A to FIG. 19L. Each of FIG. 19A to FIG. 19L is a sectional view illustrating first to twelfth manufacturing steps for the micro LED element 100*l* and the image display device 200*l*. The same steps as the steps illustrated in FIG. 3A to FIG. 3O will not be described. Large differences between the steps illustrated in FIG. 19A to FIG. 19L and the steps illustrated in FIG. 3A to FIG. 3O are such that besides the arrangement of electrodes, the micro LED element 100*l* is formed on a growth substrate 9*l*, is diced per image display device 200*l*, and then is bonded onto a driving circuit substrate 50*l* per dice.

Figure 19A:
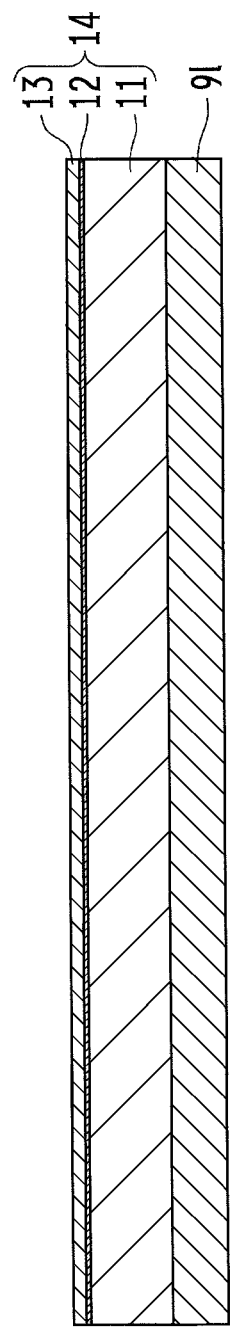
FIG. 19A is a sectional view illustrating a first manufacturing step for the image display device according to the ninth embodiment of the present disclosure.

As illustrated in FIG. 19A, while forming of the nitride semiconductor layer 14 on the growth substrate 9*l* is the same as that of the first embodiment, for example, a (0001)-plane sapphire substrate can be used as the growth substrate 9*l* in the present embodiment.

Figure 19B:
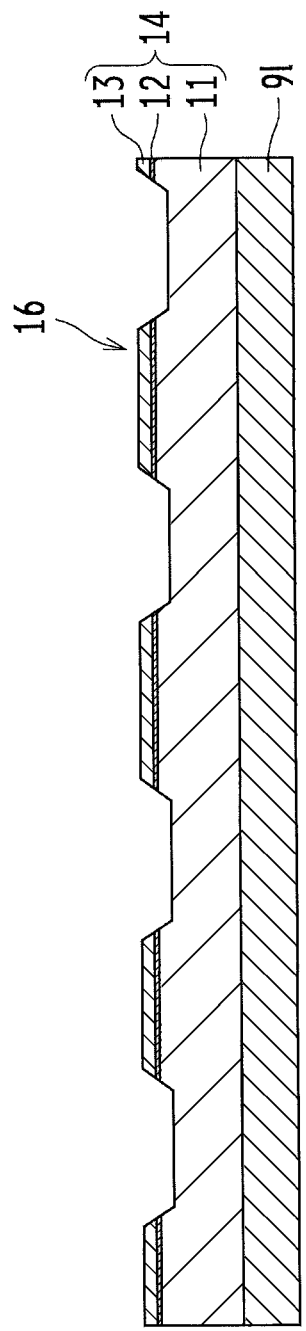
FIG. 19B is a sectional view illustrating a second manufacturing step for the image display device according to the ninth embodiment of the present disclosure.
Figure 19C:
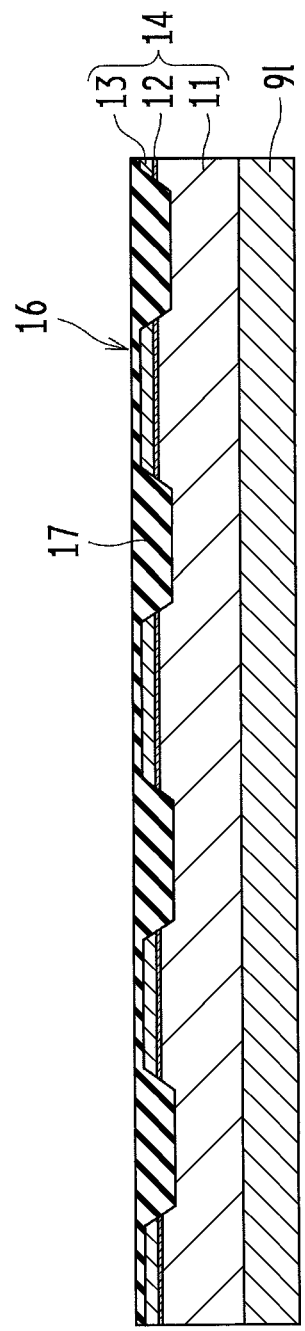
FIG. 19C is a sectional view illustrating a third manufacturing step for the image display device according to the ninth embodiment of the present disclosure.
Figure 19D:
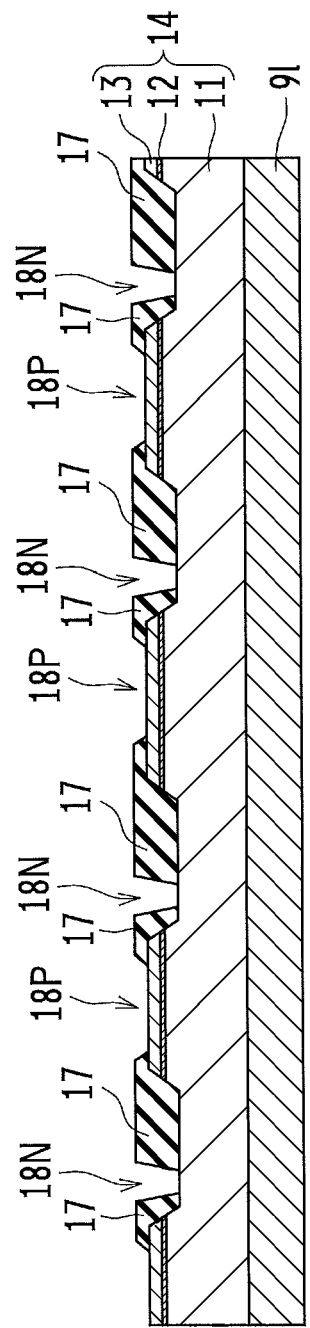
FIG. 19D is a sectional view illustrating a fourth manufacturing step for the image display device according to the ninth embodiment of the present disclosure.
Figure 19E:
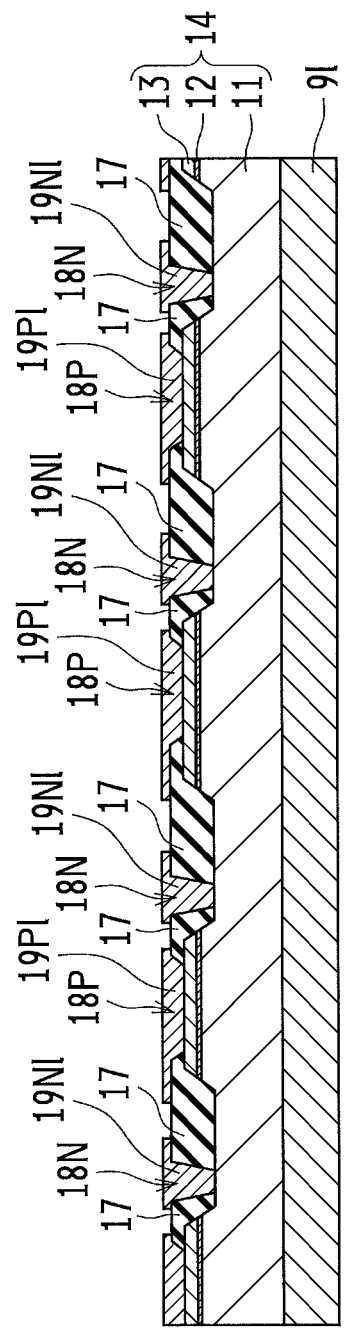
FIG. 19E is a sectional view illustrating a fifth manufacturing step for the image display device according to the ninth embodiment of the present disclosure.
Figure 19F:
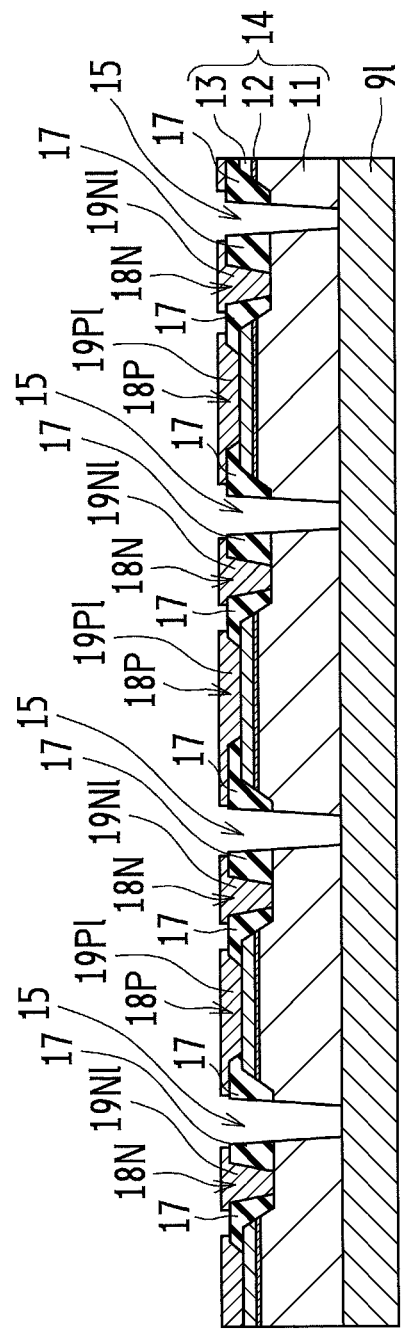
FIG. 19F is a sectional view illustrating a sixth manufacturing step for the image display device according to the ninth embodiment of the present disclosure.

As illustrated in FIG. 19B, a mesa 16 is formed by etching a part of the P-side layer 13, the light-emission layer 12, and the N-side layer 11. Then, covering is performed with a protection film 17 as illustrated in FIG. 19C. For example, the protection film 17 is silicon dioxide ($SiO_2$). Next, as illustrated in FIG. 19D, P-side contact holes 18P are open on the P-side layer 13 in the top portion of the mesa 16, and N-side contact holes 18N are open in the exposed portion of the N-side layer 11 in the bottom portion of the mesa 16. Next, as illustrated in FIG. 19E, the P-electrodes 19Pl and the N-electrodes 19Nl are respectively formed in the P-side contact holes 18P and the N-side contact holes 18N. Next, as illustrated in FIG. 19F, the protection film 17 and the nitride semiconductor layer 14 are etched, and the pixel isolation trenches 15 are formed. Each micro LED element 100*l* is isolated.

In the present configuration, it is easy to make side surface of the mesa 16 and the side surfaces of the N-side layer 11 to be inclined, because the dry etchings of the mesa 16 formation and the pixel isolation trenches 15 formation are proceeds from the P-side layer to the N-side-layer as illustrated in FIGS. 19B and 19F. All the side surfaces of the light emission layer 12 and the N-side layer 11 are inclined to be open with respect to the light emission direction. The light extraction efficiency of the micro LED element 100*l* can be increased. Furthermore, by covering the side wall of the pixel isolation trench 15 with a high reflective metal film, a leakage of light from the side surface of the micro LED element 100*l* is inhibited, and the light extraction efficiency in the light emission direction can be increased. By arranging a transparent insulating film between the side surface of the N-side layer 11 and the metal film, the light extraction efficiency of the micro LED element 100*l* can be further increased.

Figure 19G:
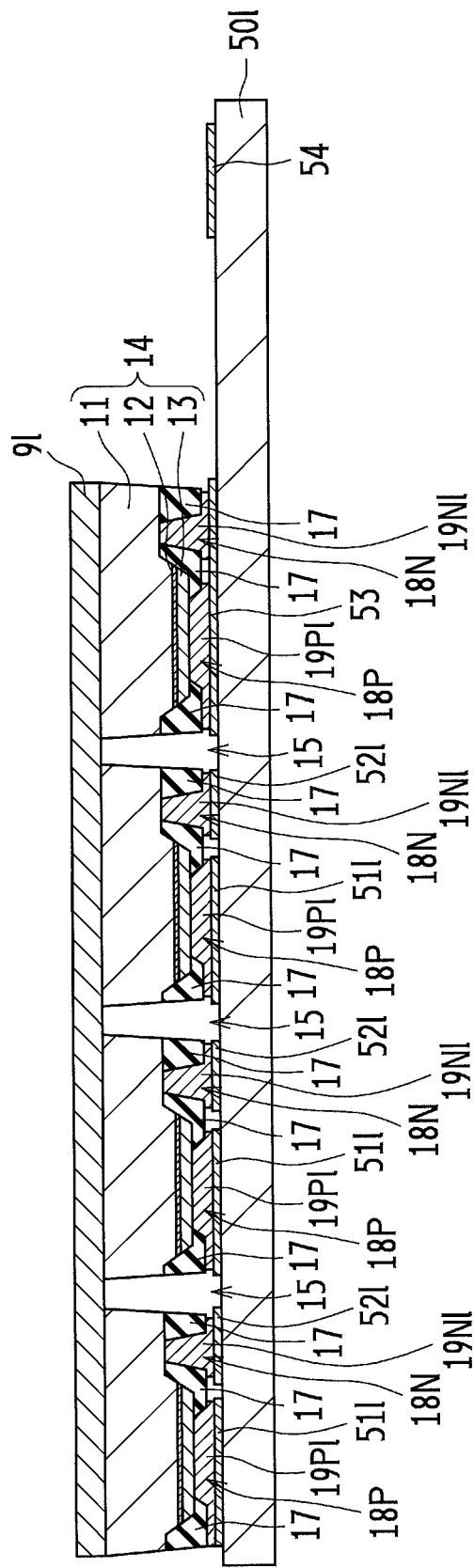
FIG. 19G is a sectional view illustrating a seventh manufacturing step for the image display device according to the ninth embodiment of the present disclosure.

While illustration is not provided, the growth substrate 9*l* in which the micro LED element 100*l* is formed is polished, is cut per image display device 200*l*, and is diced. After the dicing, bonding is performed onto the driving circuit substrate 50*l* as illustrated in FIG. 19G. The driving circuit substrate 50*l* may be in a wafer state or may be in a chip state after dividing per image display device 200*l*. Hereinafter, the driving circuit substrate 50*l* will be described as the wafer state.

Next, as illustrated in FIG. 19H, the growth substrate 9*l* is peeled. It is desirable that the bonding state in FIG. 19G is temporary adhesion, and the actual connection is performed after peeling of the growth substrate 9*l* in FIG. 19H. The reason is that, in a case that the growth substrate 9*l* is present and its thermal expansion coefficient is very different from that of the driving circuit substrate 50*l*, a process accompanying a large temperature rise is very difficult. Thus, it is preferable to perform the actual connection process accompanying large temperature rise after peeling of the growth substrate 9*l*. After the actual connection, each micro LED element 100*l* can emit light under control of the driving circuit substrate 50*l*. Accordingly, characteristics of each micro LED element 100*l* can be tested. A defective micro LED element 100*l* can be detected under control of the driving circuit substrate 50*l*. Accordingly, in a case where a defect of each micro LED element 100*l* is detected, recovery can be performed by removing the defective micro LED element 100*l* and bonding a normal product. In the present embodiment, the electrical connection of the micro LED element 100*l* is present on only the side of the driving circuit substrate 50*l* side. Thus, it is also beneficial that such recovery can be easily performed.

Figure 19L:
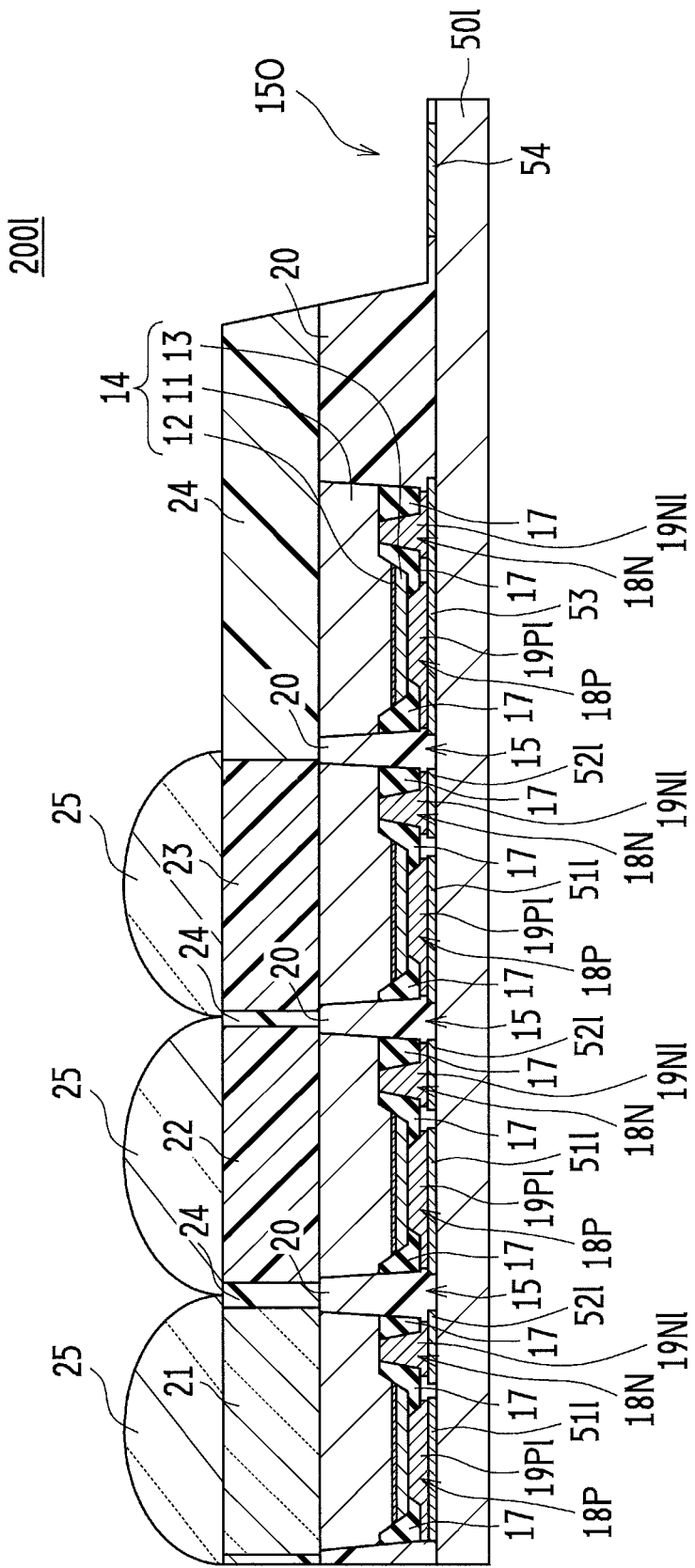
FIG. 19L is a sectional view illustrating a twelfth manufacturing step for the image display device according to the ninth embodiment of the present disclosure.

The subsequent steps are illustrated in FIG. 19I to FIG. 19L. FIG. 19I is the same step of forming the filling material 20 as FIG. 3F. FIG. 19J to FIG. 19L are the same steps as the steps illustrated in FIG. 3M to FIG. 3O, respectively. Thus, the subsequent steps will not be described. While the steps are performed on the driving circuit substrate 50*l* in the present embodiment as illustrated in FIG. 19I, the formation of the filling material 20 may be performed on the growth substrate 9*l* after FIG. 19F.

As described above, the microlenses 25 can be arranged regardless of the arrangement of electrodes of the micro LED element. Even in a case where the micro LED element is formed in advance on the growth substrate and is bonded to the driving circuit substrate per image display device, the microlenses 25 can be arranged.

Tenth Embodiment

Figure 20:
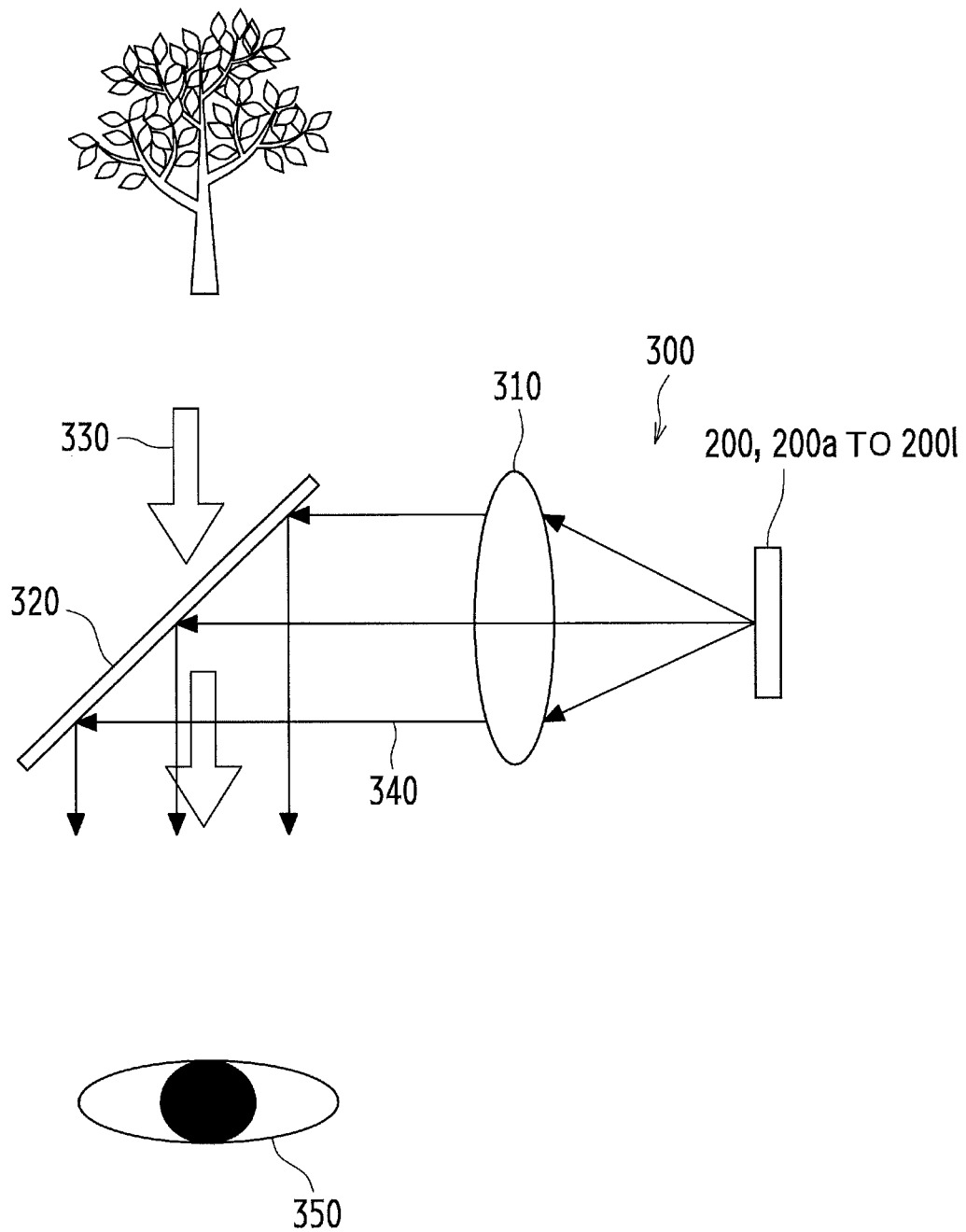
FIG. 20 is a schematic view of an AR display according to a tenth embodiment of the present disclosure.

A schematic view of an AR display 300 according to a tenth embodiment of the present disclosure is illustrated in FIG. 20. The present embodiment is the AR display 300 in which the image display devices 200 and 200*a* to 200*l* illustrated thus far are used.

As illustrated in FIG. 20, the AR display 300 includes at least the image display devices 200 and 200*a* to 200*l*, an imaging optical element 310, and a combiner optical element 320. The imaging optical element 310 may be a lens as illustrated in the example illustrated in FIG. 20 or may be a concave mirror. The combiner optical element 320 may be a half mirror as illustrated in the example in FIG. 20 or may be an optical element such as a polarizing beam splitter or a diffractive optical element. The combiner optical element 320 is arranged in front of an eye 350 of an observer and transmits a part of light 330 from an outside world. In addition, the combiner optical element 320 sends light 340 converged and projected by the imaging optical element 310 from an image displayed by the image display devices 200 and 200*a* to 200*l* to the eye 350 of the observer in a superimposed manner on the light 330 from the outside world. By doing so, the display image of the image display devices 200 and 200*a* to 200*l* is superimposed on the scenery of the outside world and is perceived by the observer.

By using the image display devices 200 and 200*a* to 200*l*, the intensity of light that can be converged by the imaging optical element 310 can be greatly increased. Accordingly, the AR display 300 in which the image display devices 200 and 200*a* to 200*l* are used can perform brighter display. Alternatively, at the same brightness, power consumption can be reduced more.

The present disclosure is not limited to each embodiment described above, and various changes can be made within the scope disclosed in the claims. Embodiments that are acquired by appropriately combining each technical means disclosed in different embodiments also fall within the technical scope of the present disclosure. Furthermore, new technical features can be formed by combining each technical means disclosed in each embodiment.

The present disclosure contains subject matter related to that disclosed in Japanese Priority Patent Application JP 2018-035299 filed in the Japan Patent Office on Feb. 28, 2018, pursuant to 35 U.S.C. 119(a), the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An image display device comprising:
   a plurality of pixels that include micro light-emission elements which are provided on a driving circuit substrate,
   wherein the micro light-emission element displays an image by emitting light to a side opposite to the driving circuit substrate, and
   a light convergence portion that converges the light is disposed in the pixel.

2. The image display device according to claim 1,
   wherein the micro light-emission element emits blue light,
   the pixel includes a blue sub-pixel that emits the blue light to the side opposite to the driving circuit substrate, and
   the light convergence portion dedicated for the blue sub-pixel is disposed on the blue sub-pixel.

3. The image display device according to claim 1,
   wherein the driving circuit substrate, the micro light-emission element, and a wavelength conversion portion are stacked in order,
   the micro light-emission element emits blue light,
   the wavelength conversion portion converts the blue light into red light,
   the pixel includes a red sub-pixel that emits the red light to the side opposite to the driving circuit substrate, and
   the light convergence portion dedicated for the red sub-pixel is disposed on the red sub-pixel.

4. The image display device according to claim 1,
   wherein the driving circuit substrate, the micro light-emission element, and a wavelength conversion portion are stacked in order, the micro light-emission element emits blue light, the wavelength conversion portion converts the blue light into green light, the pixel includes a green sub-pixel that emits the green light to the side opposite to the driving circuit substrate, and the light convergence portion dedicated for the green sub-pixel is disposed on the green sub-pixel.

5. The image display device according to claim 1, wherein the pixel includes a plurality of sub-pixels, and the plurality of sub-pixels include the light convergence portion in common that is shared by at least two sub-pixels among the plurality of sub-pixels.

6. The image display device according to claim 1, wherein the pixel includes a plurality of sub-pixels, and the light convergence portion is disposed on each sub-pixel.

7. The image display device according to claim 1, wherein the pixel includes a plurality of sub-pixels, the plurality of sub-pixels include a sub-pixel emitting light emitted by the micro light-emission element without wavelength conversion and a sub-pixel emitting long wavelength light having a longer wavelength than the light emitted by the micro light-emission element by performing wavelength conversion, and the light convergence portion is disposed on only the sub-pixel emitting the long wavelength light.

8. The image display device according to claim 1, wherein the light convergence portion is a microlens.

9. The image display device according to claim 8, wherein the microlens includes a pillar portion and a lens portion.

10. The image display device according to claim 9, wherein a length of the pillar portion is greater than $R/(n-1)$, where R is a radius of curvature of a surface of the lens portion and n is a refractive index of the lens portion.

11. The image display device according to claim 3, wherein the light convergence portion is a microlens.

12. The image display device according to claim 11, wherein a part of the microlens has a characteristic of absorbing excitation light.

13. The image display device according to claim 3, wherein a reflection layer that reflects excitation light is provided between the light convergence portion and the wavelength conversion portion.

14. The image display device according to claim 1, wherein the light convergence portion is a reflection wall.

15. The image display device according to claim 14, wherein the reflection wall is inclined.

16. The image display device according to claim 14, wherein in a plan view seen from a light emission direction, the reflection wall does not cover a light emission surface of the micro light-emission element.

17. The image display device according to claim 3, wherein a planarization portion including a light shielding material is arranged around the wavelength conversion portion, the light convergence portion is a microlens, and the microlens is arranged to cover the planarization portion.

18. The image display device according to claim 3, wherein a planarization portion including a light shielding material is arranged around the wavelength conversion portion, the light convergence portion is a reflection wall, and the reflection wall is arranged on only the planarization portion.

19. The image display device according to claim 3, wherein a planarization portion including a light shielding material is arranged around the wavelength conversion portion, and the planarization portion does not cover a light emission surface of the micro light-emission element.

20. A display comprising:

the image display device according to claim 1;

an imaging optical element; and a combiner optical element.

* * * * *